(12) United States Patent
Bagheri et al.

(10) Patent No.: US 7,941,475 B2
(45) Date of Patent: May 10, 2011

(54) PROGRAMMABLE FILTER CIRCUITS AND METHODS

(75) Inventors: Rahim Bagheri, Los Angeles, CA (US); Ahmad Mirzaei, Los Angeles, CA (US)

(73) Assignee: WiLinx Corporation, Carlsbad, CA (US)

( * ) Notice: Subject to any disclaimer, the term of this patent is extended or adjusted under 35 U.S.C. 154(b) by 1085 days.

(21) Appl. No.: 11/501,382

(22) Filed: Aug. 9, 2006

(65) Prior Publication Data
US 2008/0122529 A1 May 29, 2008

(51) Int. Cl.
G06G 7/02 (2006.01)
(52) U.S. Cl. ...................................................... 708/819
(58) Field of Classification Search ................. 708/819, 708/3
See application file for complete search history.

(56) References Cited

U.S. PATENT DOCUMENTS

| | | | | |
|---|---|---|---|---|
| 4,320,391 | A | * | 3/1982 | Mallett ........................ 341/117 |
| 4,573,026 | A | * | 2/1986 | Curtis et al. .................. 332/124 |
| 4,724,709 | A | * | 2/1988 | Antonazzi et al. ............. 73/701 |
| 5,325,322 | A | | 6/1994 | Bailey et al. |
| 5,931,898 | A | * | 8/1999 | Khoury ........................ 708/819 |
| 6,882,292 | B1 | * | 4/2005 | Bardsley et al. ............. 341/121 |

FOREIGN PATENT DOCUMENTS

| | | |
|---|---|---|
| CA | 1087255 A1 | 10/1980 |
| WO | 03015027 A2 | 2/2003 |

OTHER PUBLICATIONS

R. Bagheri et al, "An 800MHz to 5GHz Software-Defined Radio Receiver in 90nm CMOS", 2006 IEEE International Solid-State Circuits Conference, Feb. 8, 2006, pp. 480-481, 667.
K. Muhammad et al, "Direct RF Sampling Mixer With Recursive Filtering In Charge Domain", Wireless Analog Technology Center Texas Instruments Inc., 2004, pp. 577-580.
R. Bodgan Staszewski et al, "All-Digital TX Frequency Synthesizer and Discrete-Time Receiver for Bluetooth Radio in 130-nm CMOS", Wireless Analog Technology Center Texas.
Staszewski et al continued, Dec. 2004, pp. 2278-2291, vol. 52, No. 2.
Sami Karvonen et al, "A CMOS Quadrature Charge-Domain Sampling Circuit With 66-dB SFDR Up to 100 MHz", IEEE Transactions on Circuits and Systems, Feb. 2005, vol. 52, No. 2.
K. Muhammad et al, "A Discrete Time Quad-band GSM/GPRS Receiver in a 90nm Digital CMOS Process", IEEE 2005 Custom Integrated Circuits Conference, Jul. 2005, pp. 809-812.

(Continued)

*Primary Examiner* — Tan V Mai
(74) *Attorney, Agent, or Firm* — Heimlich Law, PC; Alan Heimlich, Esq.

(57) ABSTRACT

Embodiments of the present invention include programmable filter circuits and methods. In one embodiment, the present invention includes a programmable filter for filtering an input signal comprising a storage element for storing a plurality of digital values representing a discrete time window function, and a plurality of filter channels, each channel comprising a multiplying digital-to-analog converter having a plurality of digital inputs coupled to the storage element and an analog input for receiving said input signal to be filtered, at least one capacitor having at least one terminal coupled to an output of the multiplying digital-to-analog converter, and a sampling device coupled between the at least one terminal of the at least one capacitor and an output of the filter. In another embodiment, the present invention includes a software defined radio.

18 Claims, 19 Drawing Sheets

OTHER PUBLICATIONS

J. Yuan, "A Charge Sampling Mixer With Embedded Filter Function For Wireless Applications", International Conference on Microwave and Millimeter Wave Technology Proceed.

Yuan continued, Sep. 2004, pp. 315-318.

Y. S. Poberezhskiy, "Sampling and Signal Reconstruction Circuits Performing Internal Antialiasing Filtering and Their Influence on the Design of Digital Receivers".

Poberezhskiy continued, IEEE Transactions on Circuits and Systems, Jan. 2004, pp. 118-129, vol. 5, No. 1.

Mirzaei et al., "A Second-Order Anti-Aliasing Prefilter for an SDR Receiver," IEEE Custom Integrated Circuits Conferemce, Sep. 18-21, 2005, p. 629-632.

Satoru C. Tanaka, Hsin-Fu Tseng, Lyon T. Lin and Pao-Jung Chen, "An Integrated Real-Time Programmable Transversal Filter," Database Compendex [Online] Engineering Information, Inc., New York, NY, US; Dec. 1980.

Stephen K. Sunter, Emil F. Girczyc, and Adam Chowaniec, "A Programmable Transversal Filter for Voice-Frequency Applications," Database Compendex [Online] Engineering Information, Inc. New York, NY, US; Aug. 1981.

Kou-Hung Loh, Douglas L. Hiser, William J. Adams and Randall L. Geiger, A Versatile Digitally Controlled Continuous-Time Filter Structure with Wide-Range and Fine Resolution Capability. IEEE Transactions on Circuits and Systems II: Analog and Digital Signal Processing, vol. 39, No. 5, May 1992.

Yusuf A. Haque, "An Adaptive Transversal Filter," ICASSP, IEEE International Conference on Acoustics, Speech and Signal Processing—Proceedings. pp. 1208-1211. 1983.

Extended European Search Report (EESR)—From a corresponding foreign application, EP 08000773.5, mailed Oct. 8, 2008.

Extended European Search Report (EESR)—From a corresponding foreign application, EP 08000773.5, mailed Mar. 30, 2009.

\* cited by examiner

PROGRAMMABLE FILTER CIRCUITS AND METHODS

BACKGROUND

The present invention relates to filter circuits, and in particular, to programmable filter circuits and methods.

Filters are electronic circuits that pass electronic signal components at some frequencies and reject (e.g., attenuate or block) components at other frequencies. FIG. 1A illustrates a prior art filter. Filter 101 may receive an electronic signal, x(t), and output another signal, y(t). If the input signal, x(t), include multiple frequency components, the filter may only pass some, but not all, of such components. Thus, the output signal, y(t), may only include the frequencies that the filter passes. FIG. 1 further illustrates the frequency response, $F_1(\omega)$, of an ideal filter. An input signal may include two frequency components 110 and 120. As shown in the graph, the frequency response at zero frequency (i.e., DC) is unity (i.e., |F|=1). The frequency response remains unity across a range of frequencies and then falls off at higher frequencies. When the frequency response of the filter is unity at a given frequency, signals at such frequency will be passed through to the output. However, when the frequency response is less than unity, signals will be attenuated. FIG. 1 illustrates two frequency components 110 and 120 of the filter input, x(t). Component 110 is at a frequency where the filter has a unity frequency response. Thus, frequency component 110 of input signal, x(t), will pass through the filter. However, frequency component 120 is at a frequency where the filter has a frequency response less than unity. Thus, frequency component 120 of input signal will be attenuated as it is passed through filter 101. The range of frequencies that are passed by a filter is sometimes referred to as the "passband" of the filter, and the range of frequencies that are attenuated or blocked by a filter is sometimes referred to as the "stop band." The range of the passband, in frequency is commonly referred to as the "bandwidth" of the filter. The frequency response illustrated in the graph in FIG. 1 is an example of a low pass filter ("LPF") because low frequencies from zero up to the bandwidth are passed, and higher frequencies above the bandwidth are increasingly attenuated. In practice, filter passbands may attenuate or amplify a signal. A passband is distinguished from a stop band by the relative attenuation (or gain) of the responses in each band.

Programmable filters have changeable filter characteristics. For example, filter 101 may receive a program signal that changes the frequency response of the filter. The program signal may be an analog or digital signal(s) that changes the characteristics of the passband and/or stop band of the filter, for example. As shown in the graph in FIG. 1, a programmable filter may be used to change the frequency response between a first frequency response, $F_1(\omega)$, and a second frequency response, $F_2(\omega)$. In this example, the second frequency response simply has a wider bandwidth than the first frequency response. Accordingly, in one configuration the filter may pass only component 110 and attenuate or block component 120, and in another configuration the filter may pass both components 110 and 120. Programmable filters are useful in applications where an electronic system is implementing different processing functions at different times. Rather than including multiple different filters, a single programmable filter may be provided and reprogrammed for different uses.

FIG. 1B further illustrates two common filter implementations. A first example filter implementation includes a resistor and capacitor network. An input signal, x(t), is provided at the first terminal of a resistor 130. The second terminal of resistor 130 is connected to the first terminal of a capacitor 131. The second terminal of capacitor 131 is connected to ground. The output, y(t), is taken at the node between resistor 130 and capacitor 131. This simple RC configuration implements a low pass filter, which will pass frequencies up to approximately the following frequency:

$$f=1/(2\pi RC).$$

Frequencies above this frequency will be increasingly attenuated as the frequency response falls off (or "rolls off"). The second example filter implementation includes a network of inductors and capacitors. Two inductors 141 and 143 are coupled in series between the input and output. A first capacitor 142 is coupled from an intermediate node between the two inductors and ground, and a second capacitor 144 is coupled between the output and ground. This filter is also a bandpass filter, but because two (2) inductor-capacitor networks are coupled together, the frequency response will fall off faster than the RC network, leading to larger attenuations at frequencies just above the cutoff frequency.

Common approaches to programming filters have included changing the values of the resistors, capacitors, or inductors that are used in the filter. However, this approach may not always practical where substantial changes in the filter characteristics are required. For example, in some applications changing a filter from a 100 kHz bandwidth to a 20 MHz bandwidth may not be practical using this approach.

FIG. 2 illustrates another problem relating to filter programmability. In many systems, it is desirable to digitize a signal after it has been filtered. For example, a signal, x(t), may be received by a filter 201 and then coupled, either directly or through other components, to an analog-to-digital converter ("A/D") 202. A/D 202 converts the filtered signal into N digital bits that may be processed digitally, for example. However, when a signal is digitized by sampling the continuous time signal at a sample frequency, $f_s$, aliasing of the signal frequencies may cause higher frequencies to be translated to lower frequencies. For example, if a sampled input signal, x(t), has frequency components at integer multiples of the sample frequency, then aliasing will cause these components to move to zero frequency. As shown in the diagram in FIG. 2, frequency components 210, 211, and 212 of an inputs signal x(t) may be shifted down to zero frequency after sampling. Thus, a signal component of interest 213, which in this example is a DC signal, may be completely lost when the higher frequency components are shifted to the same frequency. Therefore, in some applications (such as the above example of sampling a signal of interest, located at or close to DC) it is desirable to have a filter that will provide strong attenuation at integer multiples of the sample frequency so that the effects of frequency components at multiples of the sample frequency are reduced or eliminated.

FIG. 2 also includes a potentially desirable filter specification including a low frequency pass band 221, strong attenuation stop bands at 223A, 223B, and 223C (e.g., which are locations of interfering signals aliasing on top of the signal of interest), and moderate attenuation for other out of band signals at 222A, 222B, and 222C. Designing a programmable filter with this filter specification can be very challenging. In some applications, the programmable filter may need to accommodate changing bandwidths ("BW"), different sample frequencies, or different passband and/or stop band frequencies, gains, or attenuation levels. In many applications, implementing such a filter using traditional approaches is not efficient or practical.

FIG. 3A is a theoretical windowed integration sampler. A windowed integration sampler include a multiplier 301, capacitor 302, and sampler 303 (e.g., a switch). An input signal, x(t), is received at one input of the multiplier 310, and the other input to the multiplier receives a window function, w(t). The output of multiplier 301 is coupled to capacitor 302. Capacitor 302 is first discharged through switch 304 and then integrates the multiplier output, and the result is sampled. The output, $y(t_o)$, represents one sample of the integrated product of the input signal and window function. The output, $y(t_o)$, may be represented as follows:

$$y(t_o) = \int_{t_0-T_W}^{t_0} x(\tau)w(\tau - t_o)d\tau, \quad \text{(eq. 1)}$$

where $T_w$ is the length of the window function. FIG. 3B shows a continuous time filter x(t) as input, y(t) as output and h(t) as filter impulse response. Output( $y(t_o)$ ) can be described by following integral convolution formula:

$$y(t_o) = \int_{-\infty}^{+\infty} x(\tau)h(t_o - \tau)d\tau, \quad \text{(eq. 2)}$$

For a causal finite impulse response (FIR) filter, h(t)=0 for t<0 and t>$T_{FIR}$. Thus eq. 2 can be rewritten as:

$$y(t_o) = \int_{t_0-T_{FIR}}^{t_0} x(\tau)h(t_o - \tau)d\tau, \quad \text{(eq. 3)}$$

Comparing eq. 1 and eq. 3 it is evident that windowed integration sampler takes the form of a convolution integral for a filter with an impulse response of h(t)=w(-t). Thus, the windowed integration sampler can be represented as a filter having a continuous time input and a discrete time output. FIG. 3B shows functionality of the windowed integration sampler. A continuous time input signal is subject to the filter, embedded in the windowed integration sampler, and then sampled to produce the discrete time output sample.

FIG. 3C is a theoretical windowed integration sampler using "n" parallel stages for generating sample outputs using "n" shifted finite length window functions, w(t), w(t–Ts), . . . , and w(t–nTs). Each stage contributes a sample for a certain position in the window function. For example, multiplier 311 receives the input signal, x(t), and a first window function w(t). The product of the window function and the input signal are integrated over the length of window function, Tw, by capacitor 312. The result is sampled at 350 to produce the first sampled output, y(nTs), where Ts is the sample period. The next sample is take from the product of the input signal and a second version of the window function that is shifted by the sample period (i.e., w(t–Ts)). The product of the input signal and the shifted window function is integrated over the length of the window function, Tw, by capacitor 322 and sampled to provide the second sampled output of y(nTs). Using multiple window functions shifted by the sample period, Ts, a discrete time signal may be obtained that represents the filtered input signal, where the filter impulse response is set by the window function.

Practical implementations of windowed integration samplers for filter applications can be difficult to realize. For example, using a filtering windowed integration sampler, it may be difficult to achieve sufficiently high attenuation levels and wide bandwidths for some applications. Additionally, it desirable to efficiently implement both the window functions and the multipliers.

Thus, there is a need for improved programmable filters. The present invention provides improved programmable filter circuits and methods.

SUMMARY

Embodiments of the present invention include programmable filter circuits and methods. In one embodiment, the present invention includes a programmable filter for filtering an input signal comprising a storage element for storing a plurality of digital values representing a discrete time window function, and a plurality of filter channels, each channel comprising a multiplying digital-to-analog converter having a plurality of digital inputs coupled to the storage element and an analog input for receiving said input signal to be filtered, at least one capacitor having at least one terminal coupled to an output of the multiplying digital-to-analog converter, and a sampling device coupled between the at least one terminal of the at least one capacitor and an output of the filter.

In another embodiment, the present invention includes a software defined radio architecture, circuits, and methods.

The following detailed description and accompanying drawings provide a better understanding of the nature and advantages of the present invention.

DETAILED DESCRIPTION

Described herein are programmable filter circuits and methods. In the following description, for purposes of explanation, numerous examples and specific details are set forth in order to provide a thorough understanding of the present invention. However, it will be evident to one skilled in the art that embodiments of the present invention may include other equivalent embodiments or modifications of the examples shown below. For example, while the embodiments and examples below are presented using triangular window functions, other window functions may be used. Thus, the invention, as defined by the claims, may include some or all of the features in these examples alone or in combination with other features described below along with equivalents.

Figure 1A:
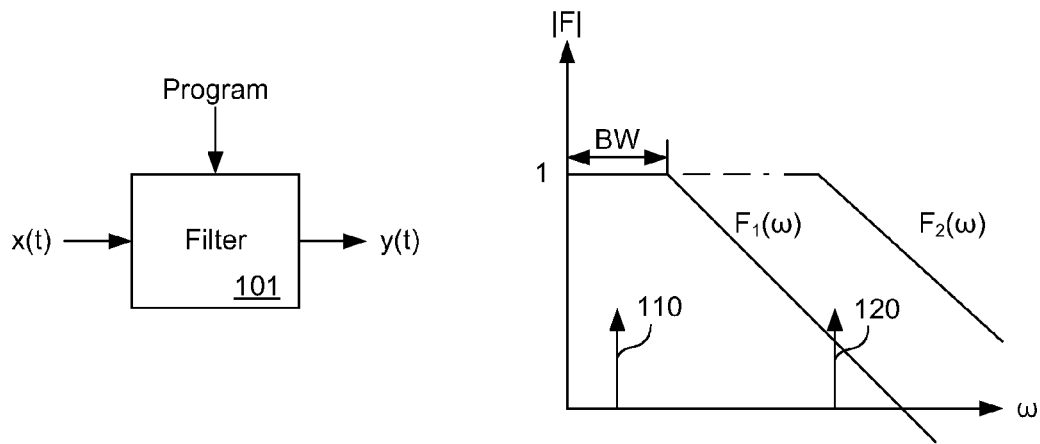
FIG. 1A illustrates a prior art filter.
Figure 1B:
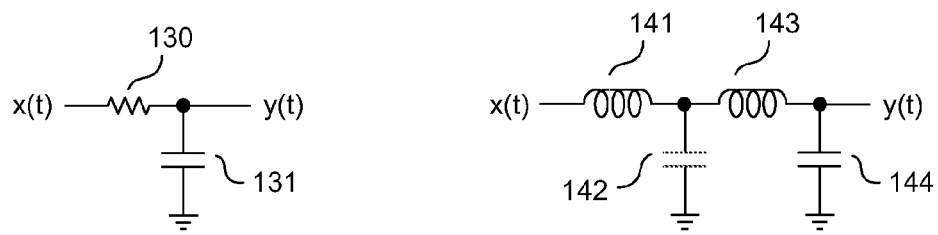
FIG. 1B illustrates two common filter implementations.
Figure 2:
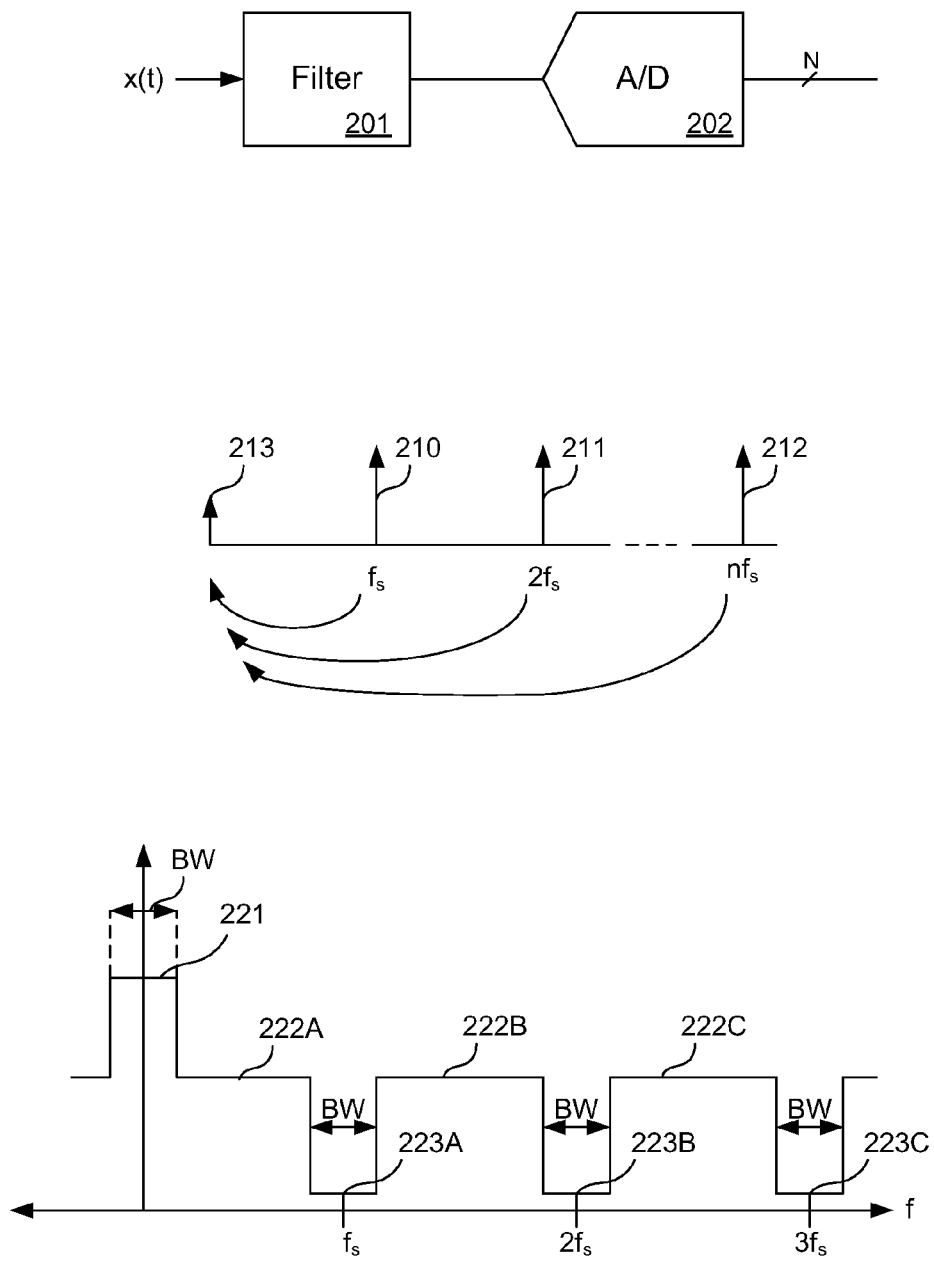
FIG. 2 illustrates filtering in a sampling application.
Figure 3A:
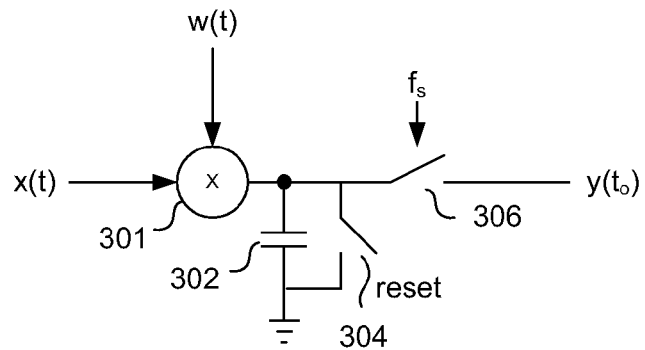
FIG. 3A is a theoretical windowed integration sampler.
Figure 3B:
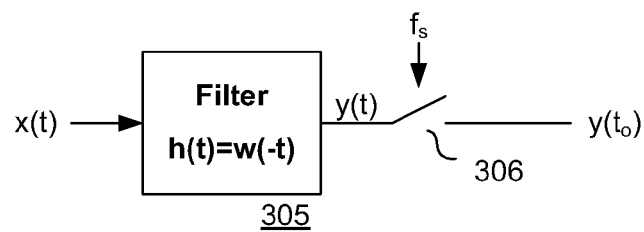
FIG. 3B shows functionality of the windowed integration sampler.
Figure 3C:
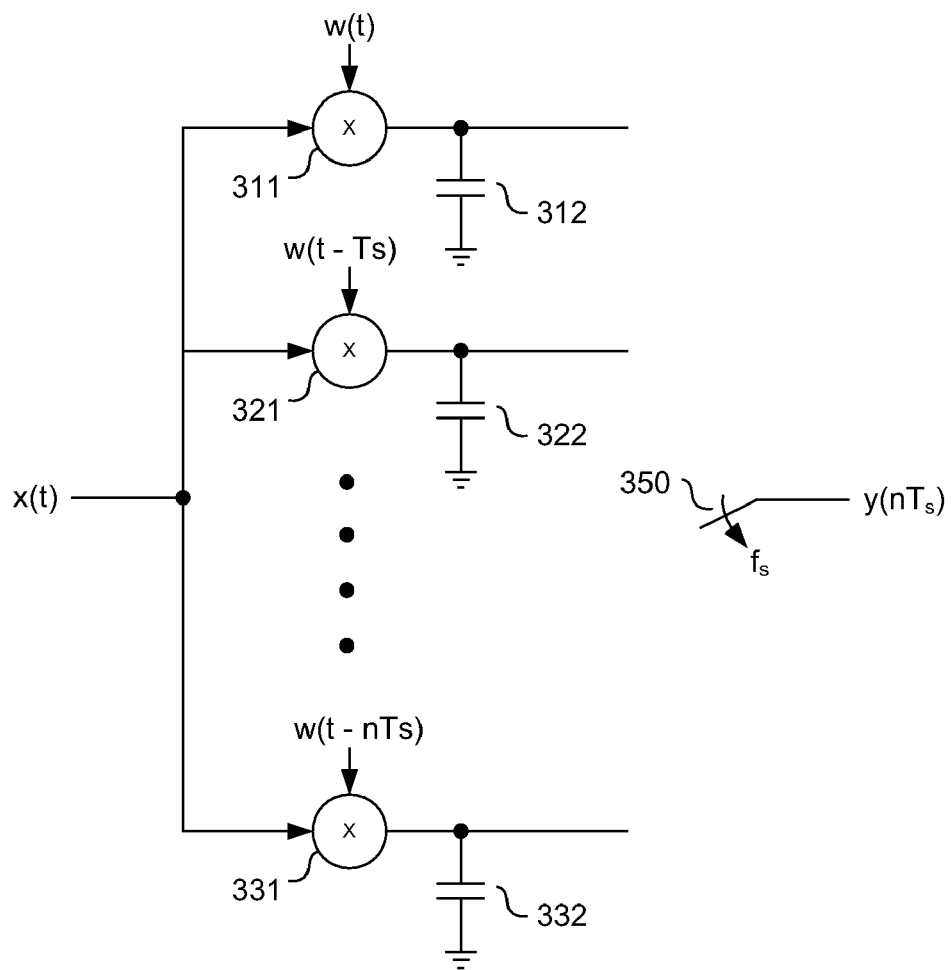
FIG. 3C is a theoretical windowed integration sampler using "n" parallel stages for generating sample outputs using "n" shifted finite length window functions.
Figure 4:
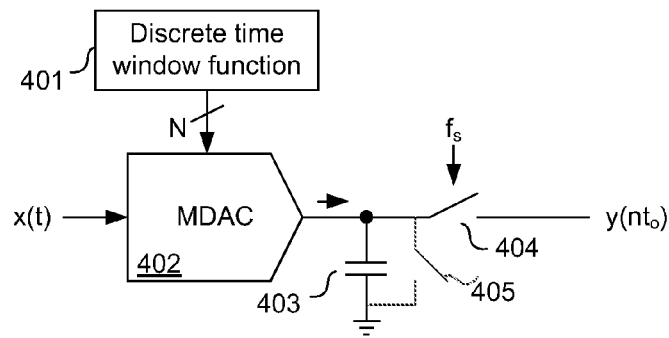
FIG. 4 illustrates a programmable filter according to one embodiment of the present invention.

FIG. 4 illustrates a programmable filter component according to one embodiment of the present invention. The circuit includes a discrete time window function stored in a storage element 401, a multiplying digital-to-analog converter ("MDAC") 402, capacitor 403, and sampling device 404. MDAC 402 includes digital inputs coupled to the storage element and an continuous time (i.e., analog) input for receiving an input signal, x(t). MDAC 402 receives a plurality of digital values (i.e., digital bits) representing a discrete time window function from storage element 401 and the input signal. MDAC 402 generates a multiplied signal at the output that represents the multiplication of the discrete time window function and the input signal, x(t). The multiplied signal at the output of MDAC 402 is integrated by capacitor 403. The result is sampled by sampling device 404 at a frequency of "fs", for example.

Discrete time window functions are sometimes also referred to as weighting functions. Embodiments of the present invention include digitally storing any discrete time window function in a storage element (e.g., a memory, registers, or other types of digital storage). The window function is provided to an MDAC as N digital values. The MDAC implements multiplication of an input signal, x(t), and the window function. In one embodiment, the output is a current representing the multiplied signal. The current is provided to a capacitor, and the multiplied signal is integrated by the capacitor. The result, typically a voltage, may be sampled at a period of time equal to the length of the window function, Tw. It is to be understood that a variety of window functions may be used. A filter using this technique may be programmed by changing the window function, for example. The MDAC, storage element, capacitor, and sampling device may be implemented in a variety of ways including differential or single-ended circuit techniques. For example, storage elements may include memories, shift register configurations, latches, volatile or nonvolatile storage, flip-flop arrays, or equivalents. MDAC 204 is a circuit that receives digital inputs and one or more analog inputs, and provides an analog output that is an integer multiple of the analog input times a unit value (e.g., the least significant bit "LSB"). One or more capacitive elements may be used for the integration. Sampling devices may include switches implemented using MOS transistors, for example, configured in a variety of ways including multiplexer configurations, for example.

Figure 5:
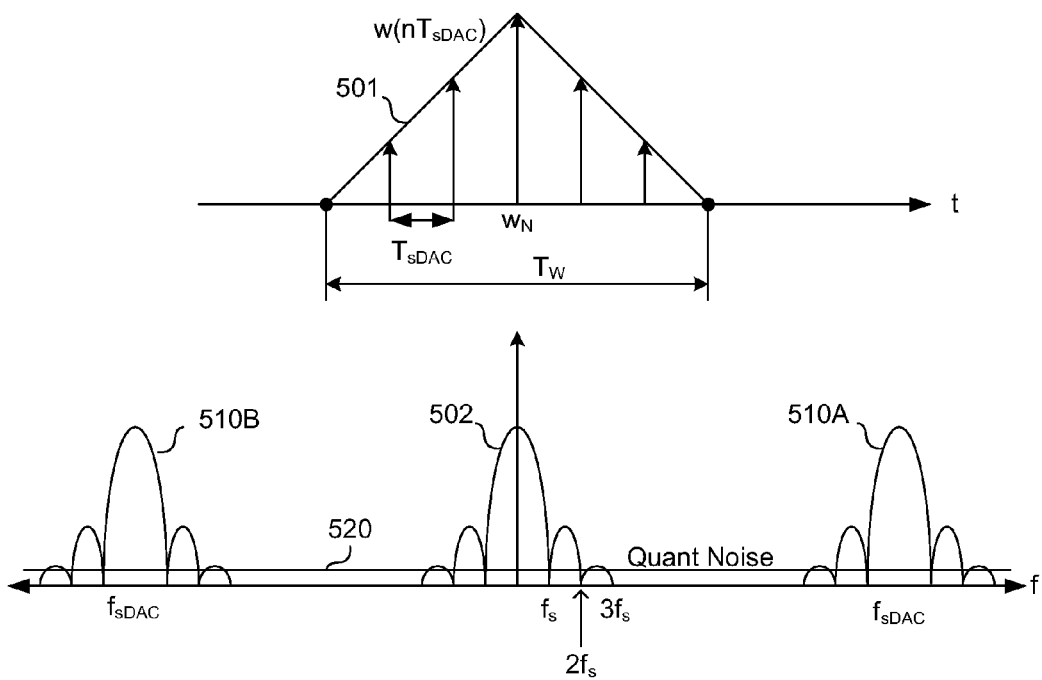
FIG. 5 illustrates time and frequency domain representations of an example discrete time window function.

FIG. 5 illustrates time and frequency domain representations of an example discrete time window function, $w(nT_{sDAC})$. This example shows a finite length triangular window function 501 having a window length (i.e., window period) of Tw. The discrete time representation of this waveform includes seven (7) samples. Each sample may be stored as a digital value. The samples are provided at a frequency of $f_{sDAC}$, which is representative of the MDAC sample frequency or the frequency at which the MDAC changes digital input values. The frequency domain representation of triangular window function 501 is a "sinc$^2$" (i.e., sinc squared) function. Thus, triangular window function 501 may be used as a filter as set forth in more detail below. The "sinc$^2$" function 502 includes nulls (i.e., notches) at integer multiples of final sample frequency, fs. The "sinc$^2$" function 502 provides strong attenuation and wider bandwidth than "sinc." However, because the window is a discrete time waveform, images of the frequency response will repeat at integers of the frequency at which the discrete time waveform is sampled. Here, the discrete time triangular waveform is sampled at a frequency of $f_{sDAC}$. Thus, images of the "sinc$^2$" function 502 will repeat as shown at 510A and 510B. FIG. 5 further illustrates another phenomenon that may occur when discrete time window functions are used. As shown at 520, quantization noise may occur as a result of representing an arbitrary continuous window function, w(t), as a discrete time window function, $w(nT_{sDAC})$. In general quantization noise may be reduced by increasing the number of bits or increasing the sampling frequency. Triangular window can be always sampled and quantized in a way which the result is free of quantization noise.

Figure 6:
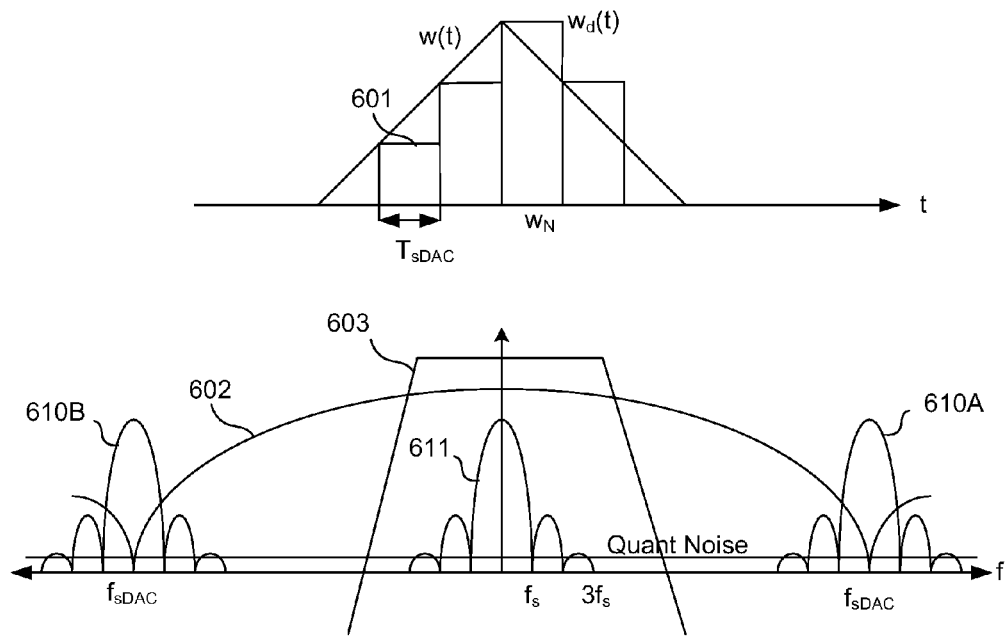
FIG. 6 illustrates time and frequency domain effects of a sample and hold system and an image reject filter on an example discrete time window function according to one embodiment of the present invention.

FIG. 6 illustrates time and frequency domain effects of a sample and hold system and an image reject filter on an example discrete time window function according to one embodiment of the present invention. In this example, the digital values are held at a constant value during the window sample period, $f_{sDAC}$, as shown at 601. Thus, rather than representing the window as pulses, the window function is represented by a succession rectangles illustrated in FIG. 6 and by $w_d(t)$. This has the effect of superimposing a "sinc" function 602 over the frequency spectrum shown in FIG. 5, with the notches of the superimposed "sinc" function at integer multiples of $f_{sDAC}$. The result is that aliased images 610A and 610B of the window function frequency spectrum 611 are suppressed by holding the window sample values constant for a period of $f_{sDAC}$. This figure illustrates another aspect of the invention. If a discrete time window function is used to program a filter, strong attenuation may be obtained in some applications (e.g., by using a triangular window) and out-of-band components near $f_{sDAC}$ may be reduced or eliminated by providing a second auxiliary filter 603 in the system. In this example, auxiliary filter (e.g., a 2$^{nd}$ order RC filter) having a response shown at 603 is used to reduce or eliminate frequency components near the images of the window function. This auxiliary filter has relaxed requirements (e.g. wide transition bandwidth) and so it can be built by a simple structure.

Consequently it is easy to reconfigure the auxiliary filter with few switch selectable components.

Figure 7:
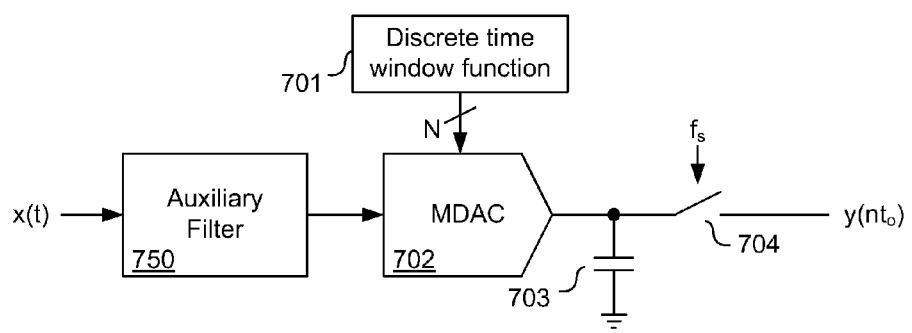
FIG. 7 illustrates a programmable filter according to another embodiment of the present invention.

FIG. 7 illustrates an auxiliary filter according to another embodiment of the present invention. Based on the discussion above, an auxiliary filter 750 may be added to the system. A continuous time input signal x(t) may first be processed by an auxiliary filter 750. The continuous time output signal from the filter is then multiplied by a discrete time window function 701 in MDAC 702. The multiplied signal provided at the output of MDAC 702 is integrated in capacitor 703 and sampled by sampling device 704 at a frequency of fs.

Figure 8:
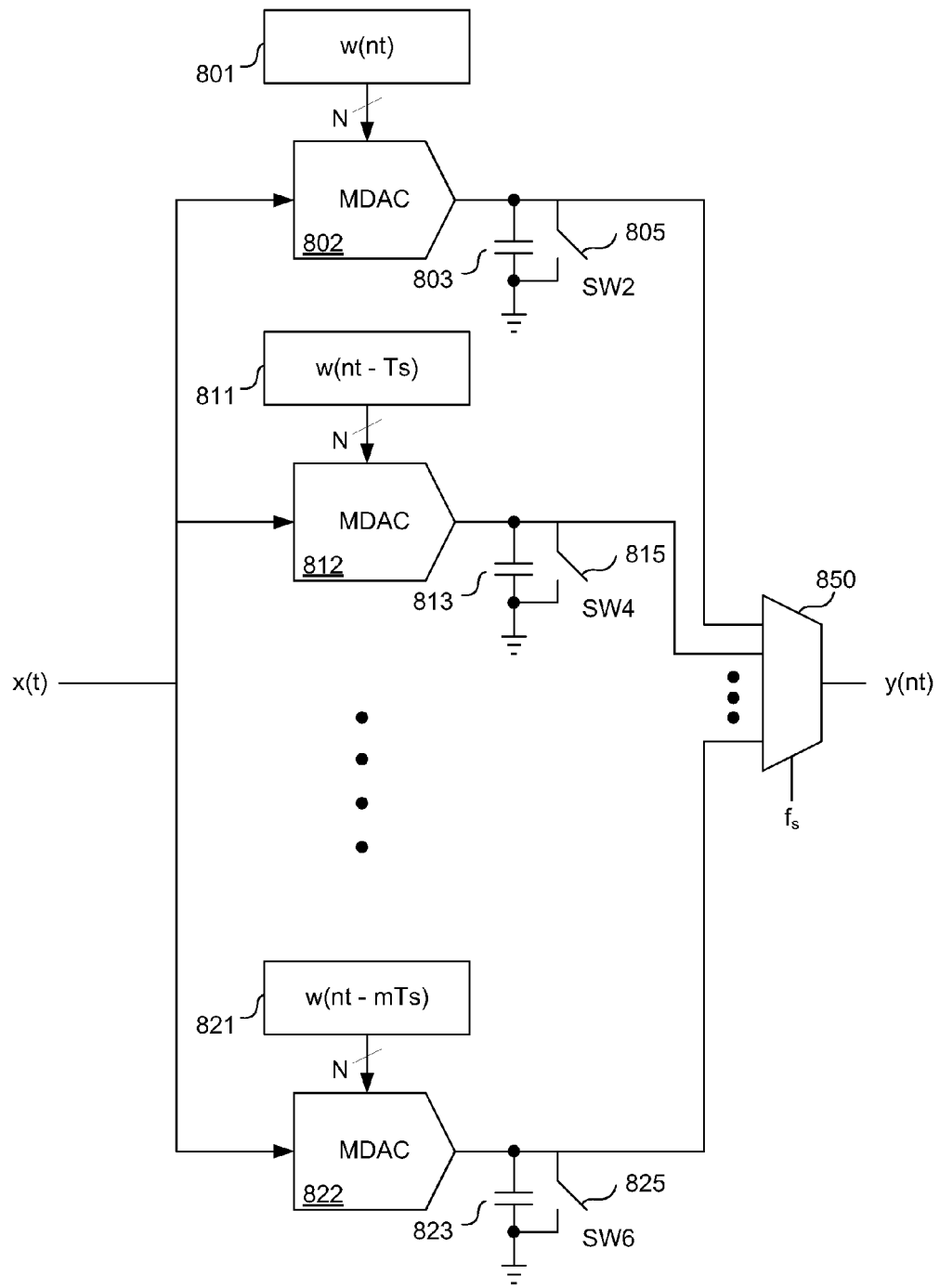
FIG. 8 illustrates a programmable filter according to an embodiment of the present invention.

FIG. 8 illustrates a programmable filter according to an embodiment of the present invention. In one embodiment, a plurality of filter channels each include an MDAC having an analog input for receiving said input signal to be filtered and a plurality of digital inputs coupled to a storage element for storing a plurality of digital values representing a discrete time window function. Each filter channel further includes at least one capacitor having at least one terminal coupled to an output of the multiplying digital-to-analog converter and a sampling device coupled between the terminal of the at least one capacitor and an output of the filter. For example, a first filter channel may include an MDAC 802 coupled to receive input signal, x(t), and further coupled to storage element 801 storing digital bits representing a discrete time window function, $w(nT_{sDAC})$. The storage element 801 is coupled to MDAC 802 by N data lines (i.e., conductive lines) each capable of carrying a data bit. The data bits are changed over time to represent the changing discrete time window function over time. MDAC 802 generates an output signal that is the multiplication of the input signal and the digital values. The output signal (e.g., a current) is integrated in capacitor 803, for example. If the capacitor is sampled after the last value of the window function has been multiplied with the input signal and the result integrated, the output is as follows:

$$y(t_o) = \int_{t_0-T_W}^{t_0} x(\tau)w_d(\tau - t_0)\,d\tau,$$

where $T_w$ is the length (or period) of the window function, wd is now the sampled and held result of the discrete time window function, and x(t) is the input to MDAC. Accordingly, each channel generates one sample of a convolution for a specific point in time on the window. Data values for the convolution at other points in time on the window may be obtained from other channels. If the length, in time, of the window function, $w_d(t)$, is Tw, the final sample frequency is fs, and Ts is the final sample period (where Tw>Ts), then the number of channels required to generate all output samples is as follows:

$$N = \frac{T_W}{T_S} + 1.$$

In some embodiments, the gain of the filter may be adjusted. For example, in one embodiment, the amplitude of the discrete time window function may be increased. Increasing the amplitude of the window function increases the gain of the filter, and decreasing the amplitude of the window function decreases the gain of the filter. Accordingly, the digital values representing the discrete time window function may be reprogrammed to change the gain of the filter. In another embodiment, the capacitor values may be changed to change the gain. Increasing the capacitor values will reduce the filter gain, and decreasing the capacitor values will increase the filter gain. For example, a plurality of capacitors may be coupled together through switches. Switches may be opened or closed to change the capacitance and thereby change the filter gain. Accordingly, the filter may be reprogrammed with different capacitor values to change the gain of the filter.

Figure 9A:
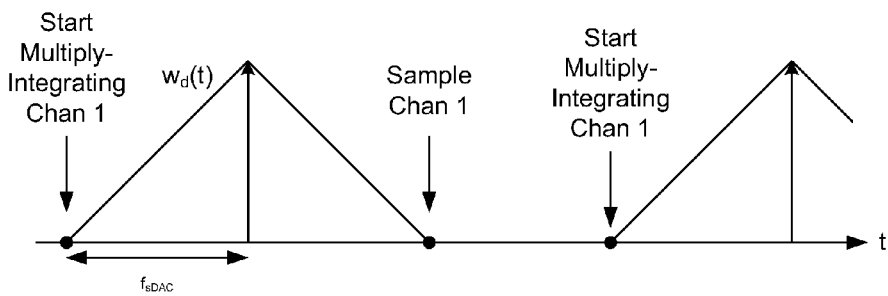
FIG. 9A illustrates windowed integration sampling using a simple discrete time window function.
Figure 9A:
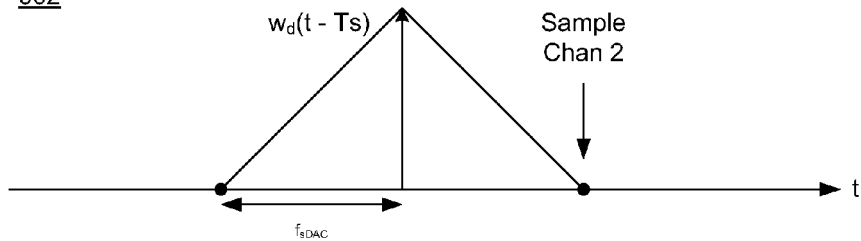
Figure 9A:
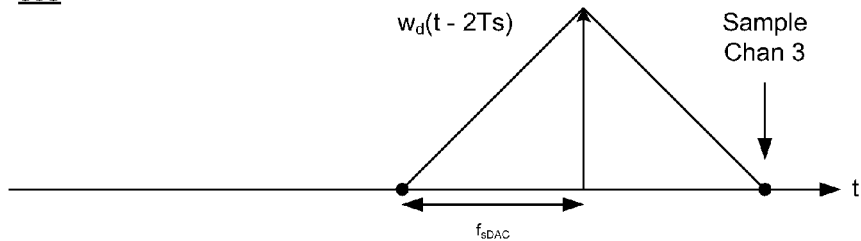

FIG. 9A is an example of windowed integration sampling using a simple discrete time window function. In this simplified example, discrete triangle window functions include three (3) data points for triangular windows on three channels 901-903. The first triangle on channel 901 is multiplied and integrated first. The second triangle on channel 902 is shifted by Ts, which is equal to one-half the window period, Tw. The third triangle on channel 903 is similarly shifted by Ts from the second triangle. Based on the above equation, it can be seen that three (3) channels are required (i.e., N=Tw/Ts+ 1=Tw/(Tw/2)+1=2(Tw/Tw)+1 =3). The first output sample is taken from the first channel after the last point in the discrete time window function 901 is provided to the MDAC, multiplied with the input signal, and integrated. After the output capacitor has integrated the last point in the window, the capacitor may be sampled. After an output capacitor is sampled, it may be reset for the next integration cycle. The second output sample is taken from the second channel. The second sample is taken after the last point in the discrete time window function 902 is provided to the MDAC, multiplied with the input signal, and integrated. The third output sample, in this example, is taken from the third channel 903 after the last value of the discrete window function has been integrated. The fourth sample is taken from the first channel. For example, when the last value of the window function in the second channel 902 is applied to the second channel MDAC, the first value of the window function in the first channel 901 is applied to the first channel MDAC. Accordingly, after the third sample is taken from the third channel, the first channel 901 will have the next subsequent output sample available on the next sample interval. It is to be understood that the above example is only a simplified example to show the relationships of Ts, Tw, $f_{sDAC}$, and the number of channels N. All of these values may be changed for different window functions with different numbers of discrete time points and different window periods Tw, different output sample frequencies fs, different MDAC frequencies $f_{sDAC}$, for example.

While FIG. 9A shows a simplified discrete time window function, any desired discrete time window function may be used. For some discrete time windows, such as a triangle window, the digital (or quantized) value generated at any sampling moment ($nT_{sDAC}$) can be precisely equal to the analog value of the continuous window at the same instant. However, for many discrete time windows, the digital values generated will not coincide with each corresponding analog value. Thus, rather than generating new discrete time window values at a rate of $f_{sDAC}$, some embodiments may use a non-uniform time intervals. For example, some continuous time waveforms may precisely coincide with available digital values (or quantization levels) at certain times during the window cycle. Thus, discrete time window function values are provided at times when the digital value corresponds to the continuous time value of the window, which may not be at an integer multiple of the $T_{sDAC}$. Accordingly, the rate at which digital values are provided is made non-uniform so that the digital values representing the discrete window match the corresponding continuous time window values. By providing digital values for the discrete time window function at non-uniform times that match the corresponding continuous time waveform, the quantization error is advantageously reduced.

Figure 9B:
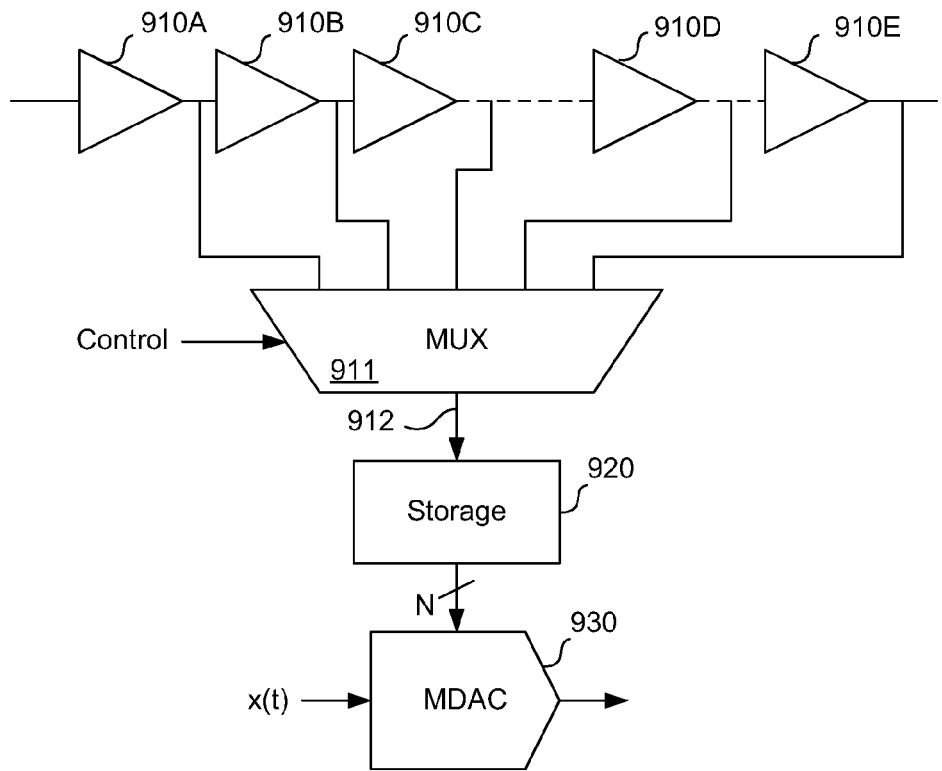
FIG. 9B illustrates windowed integration sampling using a simple discrete time window function with non-uniform sampling.
Figure 9B:
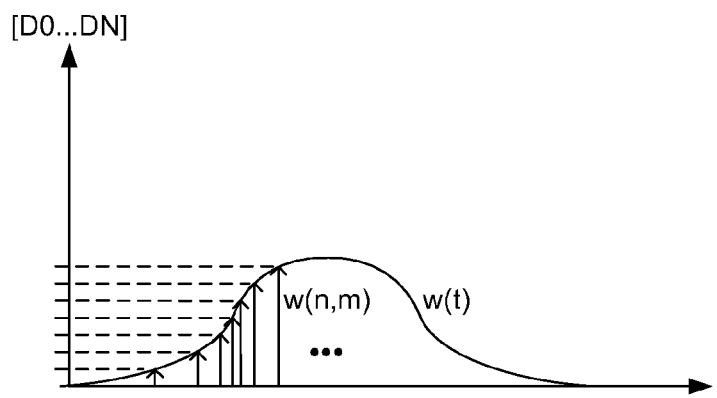

FIG. 9B illustrates windowed integration sampling using a simple discrete time window function with non-uniform sampling. In this example, a plurality of delay elements 910A-E are provided for generating delayed versions of a trigger signal such as a clock or other control signal for changing the discrete time window values provided from storage 920 to the MDAC 930. In this example, the outputs of the delay elements are coupled to the inputs of a multiplexer. The output of the multiplexer is coupled to storage 920, which holds the digital values for the discrete time window. A control signal determines which delayed signal is coupled through the multiplexer. When the delayed trigger signal is received at storage 920, the next digital value is provided to the MDAC 930. The trigger signal may be coupled to a "shift" input of a shift memory, for just one example. The control signal of the multiplexer may be coupled to a digital circuit such as a processor for monitoring the particular discrete time window stored in storage 920 and for specifying which delayed signals are used to trigger a change digital values. An example continuous time window function, w(t), is shown in FIG. 9B together with a discrete time window function, w(n,m), which uses non-uniform sampling so that the digital values representing the discrete window match the corresponding continuous time window values. 'n' is sequence number and 'm' denotes the time instant for the sample.

Figure 10:
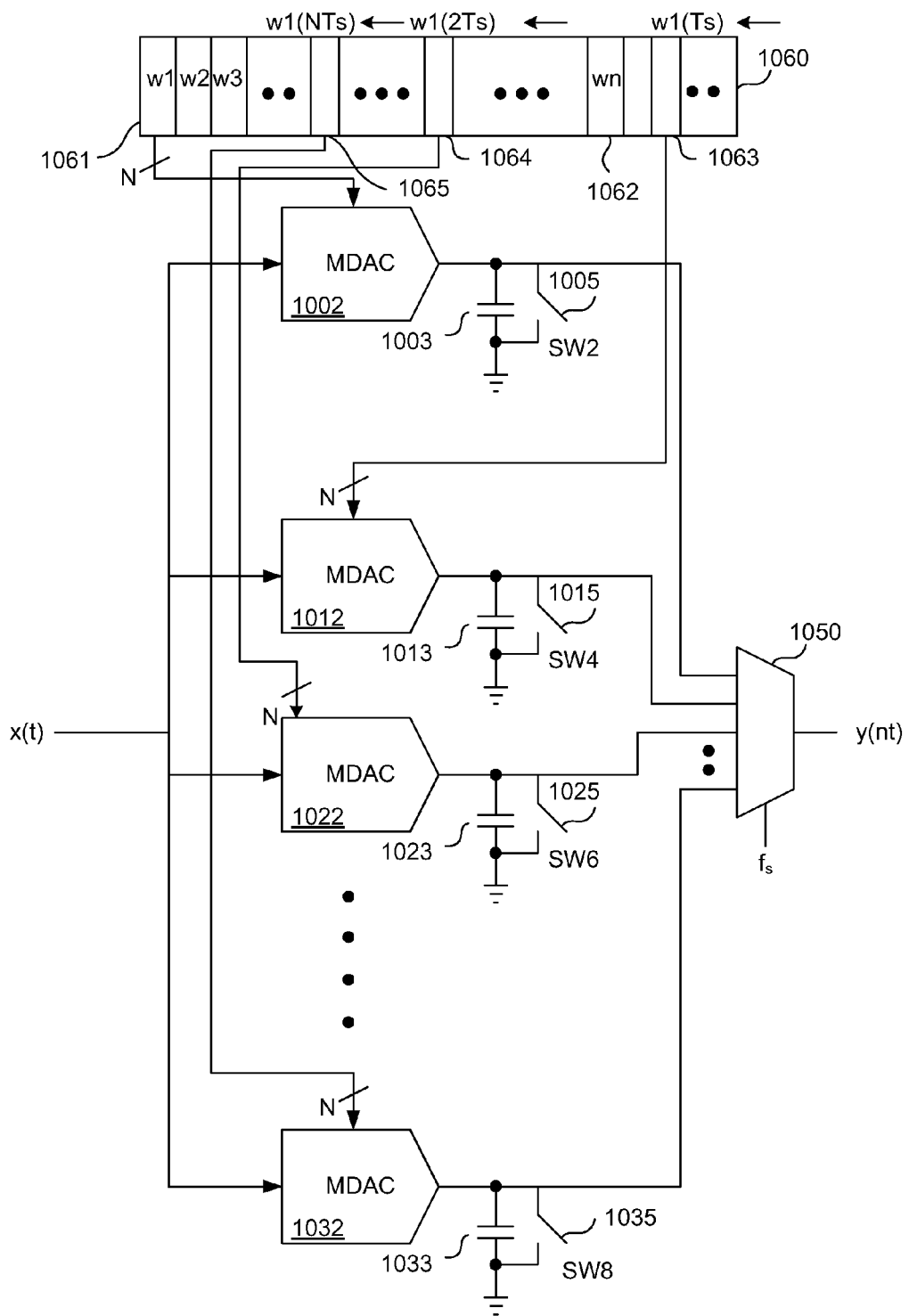
FIG. 10 illustrates a programmable filter according to another embodiment of the present invention.

FIG. 10 illustrates a programmable filter according to another embodiment of the present invention. In this example, the discrete window function values are stored in a memory 1060. For example, the first digital value corresponding to the first discrete time window function value, w1, is stored in memory location 1061. Other values of the window function are similarly stored in memory locations, which may be consecutively addressed. The last digital value corresponding to the last discrete time window function value, wn, is stored in memory location 1062. A plurality of windowed integration filter channels may each receive an analog input, x(t), and receive digital inputs from memory 1060. In one example embodiment, the first window value, w1, from memory location 1061 is coupled to MDAC 1002. The window function values may be applied to MDAC 1002 by shifting the memory values. For example, after a certain period of time, $T_{sDAC}$ (the period of the MDAC sample frequency), the memory values may be shifted down. After a shift, the window value w2 moves to memory location 1061, the window value w3 is shifted to the location where w2 was previously stored, and the window value w1 is shifted around to the last storage element of the memory 1060. After the shift, MDAC 1002 receives the second value of the discrete time window function. Each successive value of the window function may be applied to MDAC 1002 by shifting the memory at a frequency of $f_{sDAC}$. Accordingly, each discrete time window function value is multiplied by the input signal, x(t), integrated by an output capacitor (e.g., capacitor 1003), and the result sampled at a frequency of fs using multiplexer ("MUX") 1050. After sampling, capacitor 1003 may be reset, for example, using a switch illustrated by SW2 1005.

In this example, the other filter channels receive window function values from the same memory 1060. For example, after a period of time, Ts, the first value of the window function, w1, is shifted to memory location 1063 ("w1(Ts)"). Memory location 1063 is coupled to MDAC 1012 in the second filter channel so that the MDAC 1012 receives the window function shifted in time by Ts. Successive discrete time sample values of the shifted window function are multiplied by the input signal, x(t), integrated in capacitor 1013, and the result sampled by MUX 1050. After sampling, capacitor 1013 may be reset, for example, using a switch illustrated by SW4 1015. Similarly, after a period of time, 2 Ts, the first value of the window function, w1, is shifted to memory location 1064 ("w1(2 Ts)"). Memory location 1064 is coupled to MDAC 1022 in the third filter channel so that the MDAC 1022 receives the window function shifted in time by 2 Ts. Successive discrete time sample values of the shifted window function are multiplied by the input signal, x(t), integrated in capacitor 1023, and the result sampled by MUX 1050. After sampling, capacitor 1023 may be reset, for example, using a switch illustrated by SW6 1025. For additional channels, other memory locations such as location 1065 may be coupled to additional MDACs in each channel. For example, an Nth channel MDAC 1032 is coupled to memory location 1065, which receives the first value of the window function, w1, after a time NTs. Subsequent values of the window function are shifted into location 1065 at a frequency of $f_{sDAC}$. Accordingly, the discrete time window function is multiplied by the input signal, x(t), in MDAC 1032, the output is integrated in capacitor 1033, and the result sampled at a frequency of fs using MUX 1050. The combined samples are provided as an output, y(nt), which represents the discrete time values of the input signal, x(t), processed by a filter having an impulse response of w(−t), where the filter is programmable by changing the window function or sampling parameters.

Figure 11:
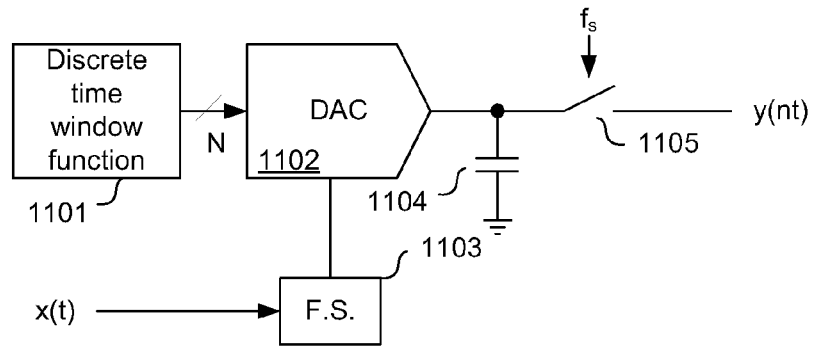
FIG. 11 illustrates a programmable filter channel according to another embodiment of the present invention.

FIG. 11 illustrates a programmable filter channel according to another embodiment of the present invention. This example illustrates an example implementation of an MDAC. A discrete time window function may be stored in a storage element 1101. Digital outputs may be provided as inputs to a digital-to-analog converter ("DAC") 1102. The full-scale ("F.S.") of the converter may be controlled by circuit 1103, which receives an input signal, x(t), as a control input to set the full-scale of the DAC. Accordingly, for any digital input, the output is the fractional value of the full-scale of the DAC set by the digital input, where the full-scale is controlled by the input signal.

Figure 12:
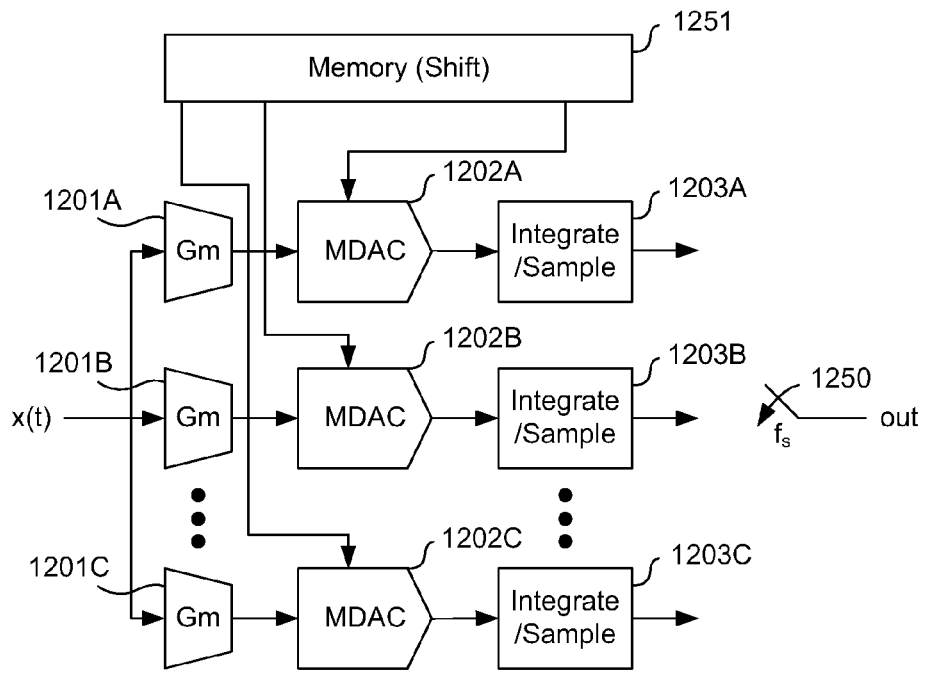
FIG. 12 illustrates a programmable filter according to another embodiment of the present invention.

FIG. 12 illustrates a programmable filter according to another embodiment of the present invention. In this example, an input signal to be filtered is received at the inputs of multiple filter channels each including a voltage-to-current converter 1201 A-C. The input signal is converted into a current in each channel and coupled to the input of respective MDACs 1202A-C. Each MDAC 1202A-C is coupled to storage, such as memory 1251, for example, which may store a discrete time window function that is shifted as described above. Storage locations have digital values that are coupled to the MDACs. The digital values are successively multiplied with the input signal, x(t), and the output is coupled to respective integrate and sample circuits 1203A-C. The output of each integrate and sample circuit is successively sample at a frequency of fs as illustrated at switch 1250 to provide sampled outputs separated by the sample period Ts.

Figure 13:
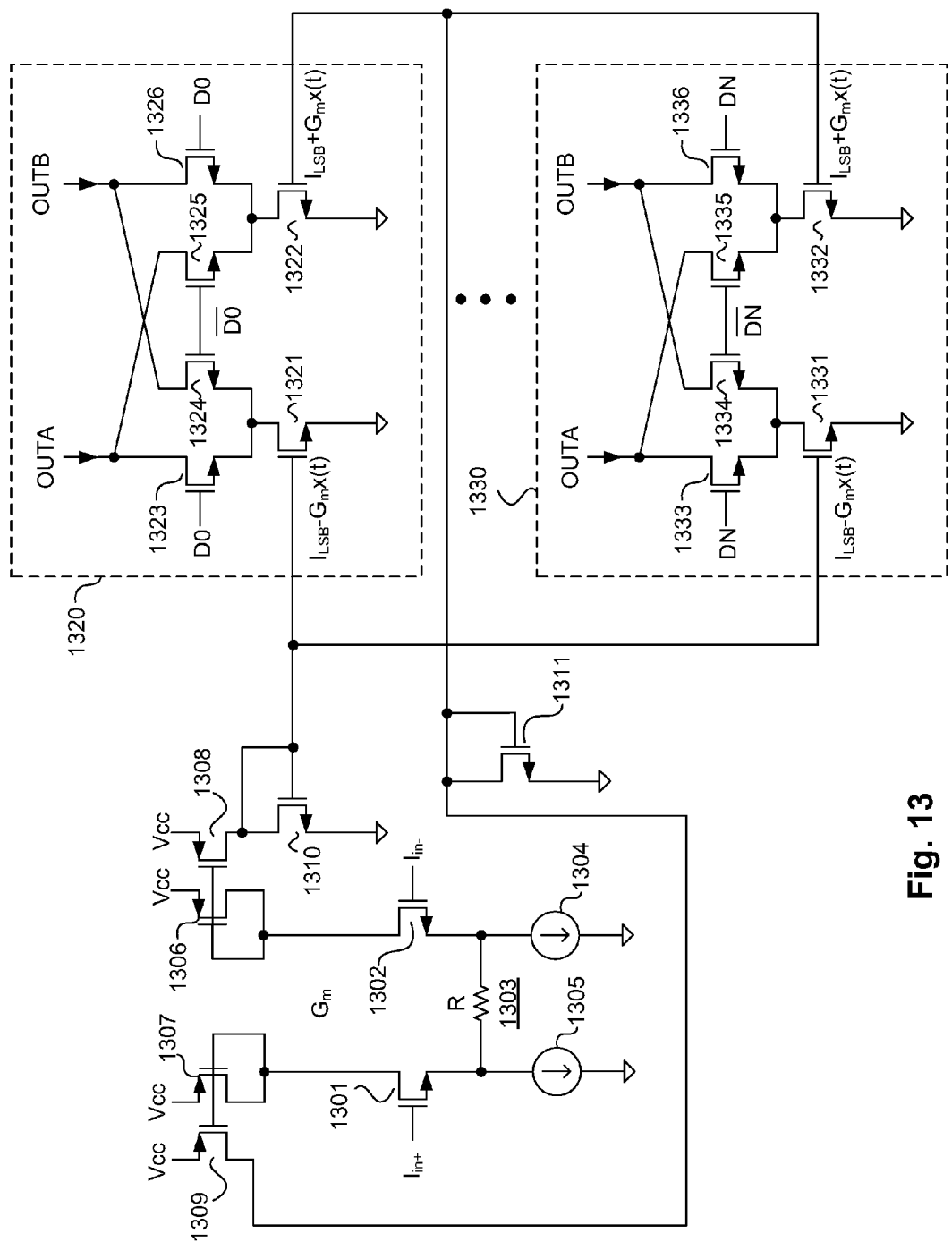
FIG. 13 is an example of a voltage-to-current converter that may be used in a programmable filter according to an embodiment of the present invention.

FIG. 13 is an example of a voltage-to-current converter that may be used in a programmable filter according to an embodiment of the present invention. A voltage-to-current converter may include at least one transistor that receives a voltage on a gate terminal and generates a current. One output terminal of a voltage to current converter may be coupled to a current mirror to generate other currents for use in the system. This example illustrates a differential voltage-to-current converter that receives an input signal on the gate terminals of transistors 1301 and 1302. This example is just one example of voltage-to-current conversion means for converting voltage-to-currents. Transistors 1301 and 1302 are biased with current sources 1304 and 1305. A differential voltage is generated across a resistor 1303, which results in a current. The differential current is mirrored through transistors 1306-1311 to any number of current source cells such as 1320 and 1330, for example. The current mirrored to each cell includes a DC current $I_{LSB}$ and an AC current $G_m x(t)$. Digital bits [D0 . . . DN] coupled from a storage element are used to control each current source cell. For example, different values of a discrete time window function may have corresponding digital bit values that turn different current cells ON or OFF to modify the current and generate the desired output. In current cell 1320, when D0 is high and D0* (i.e., NOT(D0)) is low, the differential current from the voltage-to-current converter is mirrored through transistors 1321, 1322, 1323, and 1326, and the output is as follows:

$$OUTA = I_{LSB} - G_m x(t),$$

$$OUTB = I_{LSB} + G_m x(t),$$

$$OUT\_DIFF = OUTA - OUTB = -2 G_m x(t).$$

Similarly, when D0 is low and D0* is high, the current is coupled to the outputs through transistors 1321, 1322, 1324, and 1325, and the differential output is $+2G_m x(t)$. Thus, each current cell may generate either a positive or negative output current, which represents a unit current multiplied by the input signal, x(t). The unit current may be set to any desired level. Digital bits DN and DN* may be used to control the differential outputs of any number of current cells in the same manner, such as cell 1330, for example.

Figure 14:
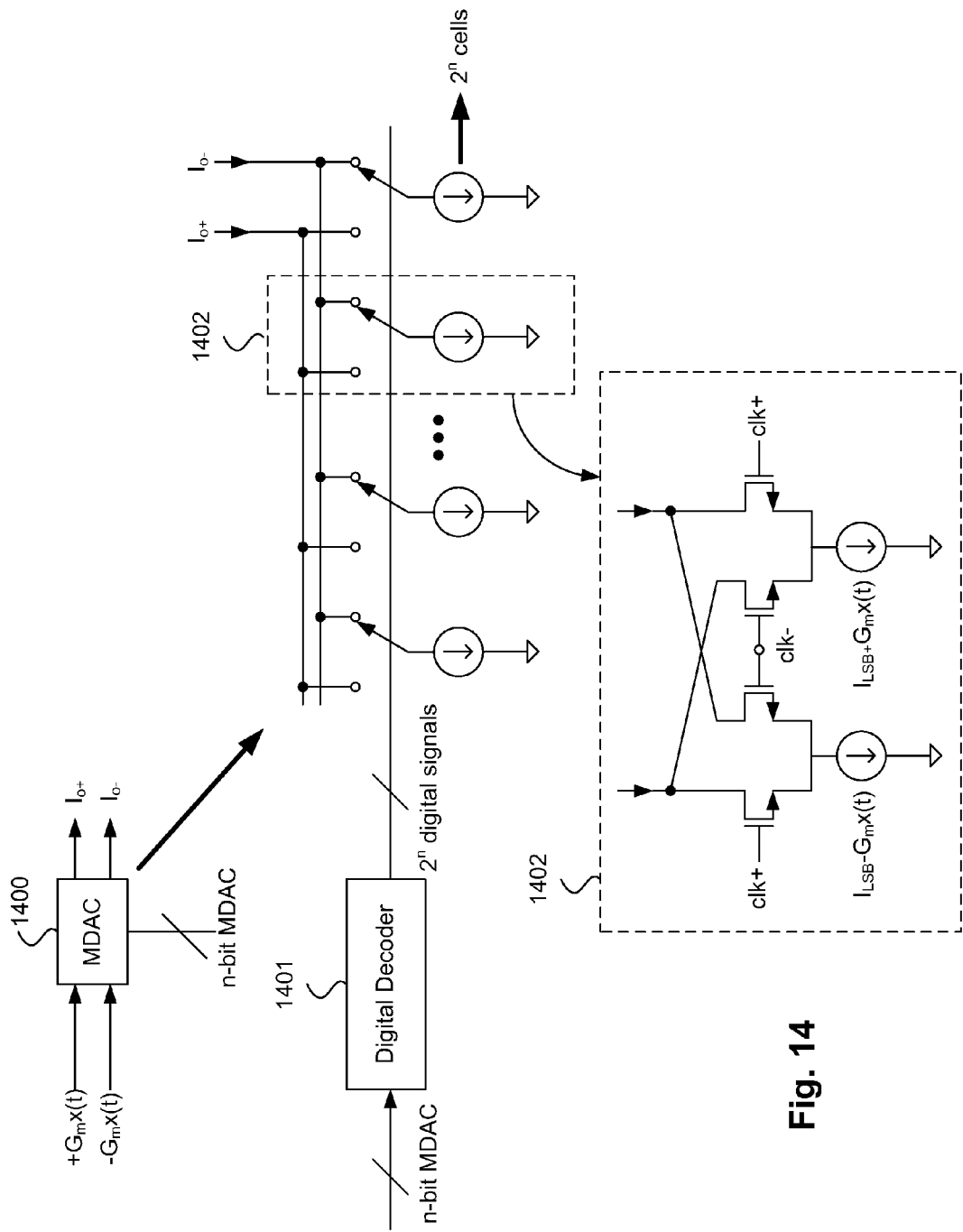
FIG. 14 is an example of an MDAC that may be used in a programmable filter according to an embodiment of the present invention.

FIG. 14 is an example of an MDAC 1400 that may be used in a programmable filter according to an embodiment of the present invention. This example is just one possible example of multiplying digital-to-analog conversion means that may be used for multiplying an analog input signal with digital values. For discrete time window function values stored as N digital bits, an MDAC 1400 may include $2^n$ current cells that may be turned ON or OFF as described above. In one embodiment, a storage element is coupled through a decoder 1401 to translate n-bits into $2^n$ control signals for turning different cells ON or OFF. For a simple illustrative example, if a storage element represents discrete window function values as two (2) bits, then four (4) current cells may be used and the following table illustrates the possible current output values that may be obtained for different bit combinations:

| D0 | D1 | OUT_DIFF |
|---|---|---|
| 0 | 0 | 4x(t) |
| 0 | 1 | 2x(t) |
| 1 | 0 | 0 |
| 1 | 1 | -2x(t) |

In the above example, Gm=½ and [1,0] represents a state where two current cells are producing OUT_DIFF=x(t) and the other two current cells are producing OUT_DIFF=-x(t). It is to be understood that the above is only a simple example to illustrate an MDAC digital control scheme that results in an output that is the product of an analog inputs signal, x(t) and stored digital values. Any combination of discrete window values, bits, cells, currents, and Gm values could be used.

Figure 15:
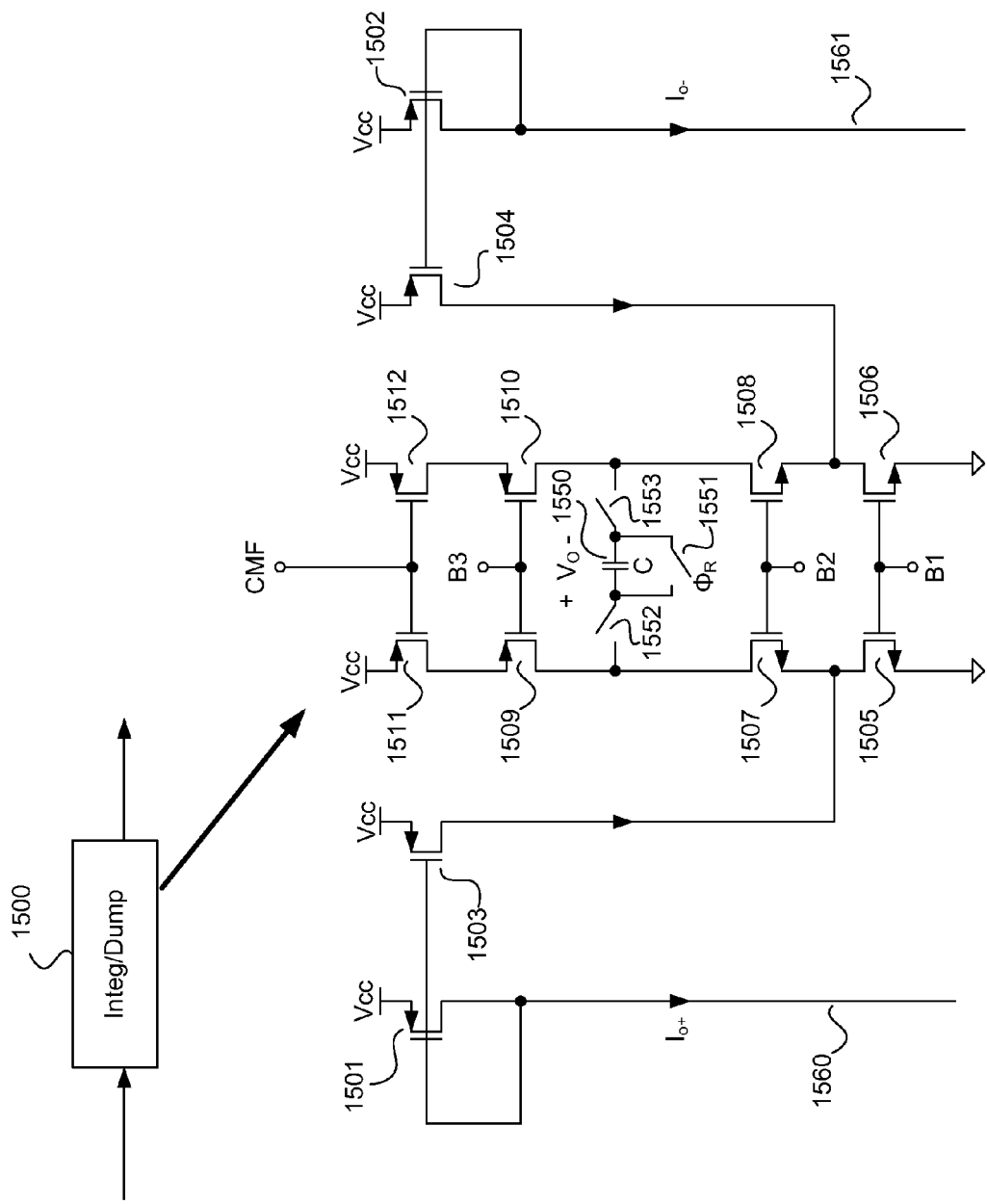
FIG. 15 is an example of an integrating circuit that may be used in a programmable filter according to an embodiment of the present invention.

FIG. 15 is an example of an integrating circuit 1500 that may be used in a programmable filter according to an embodiment of the present invention. Integrating circuit 1500 provides one possible means for integrating current, for example, from an MDAC. First, capacitor 1550 is reset using switch 1551. Then, switches 1552 and 1553 are closed and switch 1551 is opened so the capacitor is ready to integrate incoming current. Integrating circuit 1500 includes differential current inputs 1560 and 1561. The input currents are mirrored through transistors 1501-1504 into a differential cascode stage including transistors 1505-1512. The cascode stage includes a DC bias current. The current difference across capacitor 1550 is integrated, and the result is sampled (e.g., by switches that are not shown) at the end of the window cycle.

Figure 16:
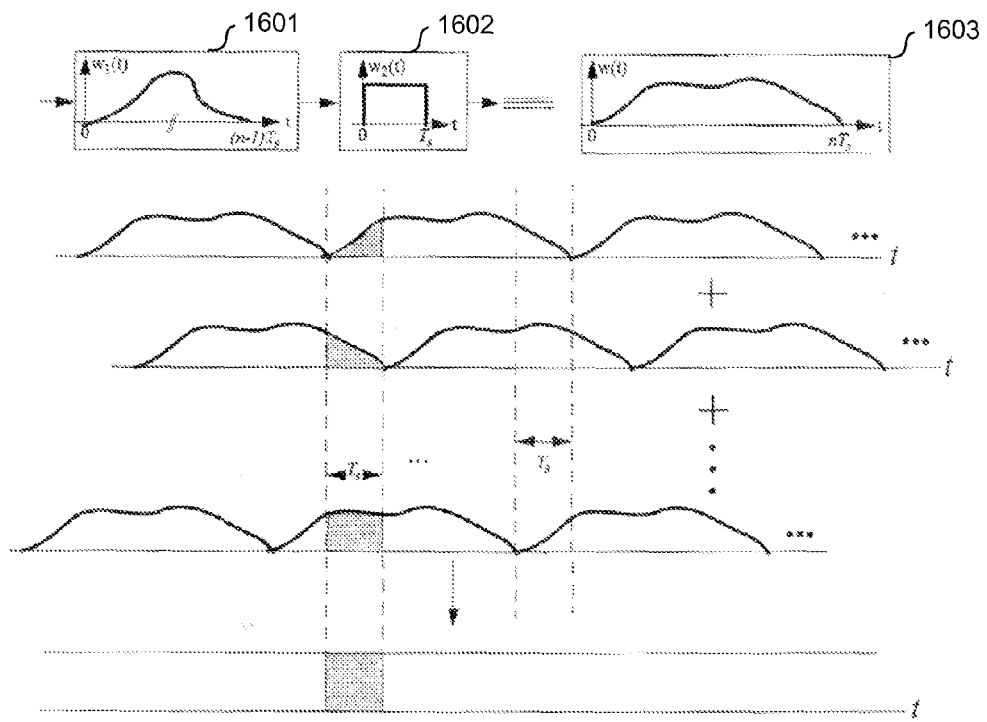
FIG. 16 illustrates a class of window functions that may be used in a programmable filter according to other embodiments of the present invention.

FIG. 16 illustrates a class of window functions that may be used in a programmable filter according to other embodiments of the present invention. An arbitrary finite length window function 1601 may be convolved with a rectangular window 1602 to produce a new window function 1603. In one embodiment, a resulting finite length window function of length nTs is decomposable as a convolution of the rectangular window of length Ts and a window function of length (n-1)Ts. Window function 1603 has the following property:

$$\sum_{i=0}^{n-1} w(t - iTs)|_{0 < t < Ts} = C,$$

where C is a constant. This phenomenon is illustrated in FIG. 16 at 910-913, which shows shifted window functions 1603 at any given point in time sum to a constant value. In the context of a programmable filter with multiple filter channels describe above, a class of discrete time window functions with the above property may be stored with advantageous results. For example, for a discrete time window function having the property of function 1603, at any give point in time, the results of the multiplication of the input signal with the discrete window function values in each filter channel will sum to a constant.

Figure 17:
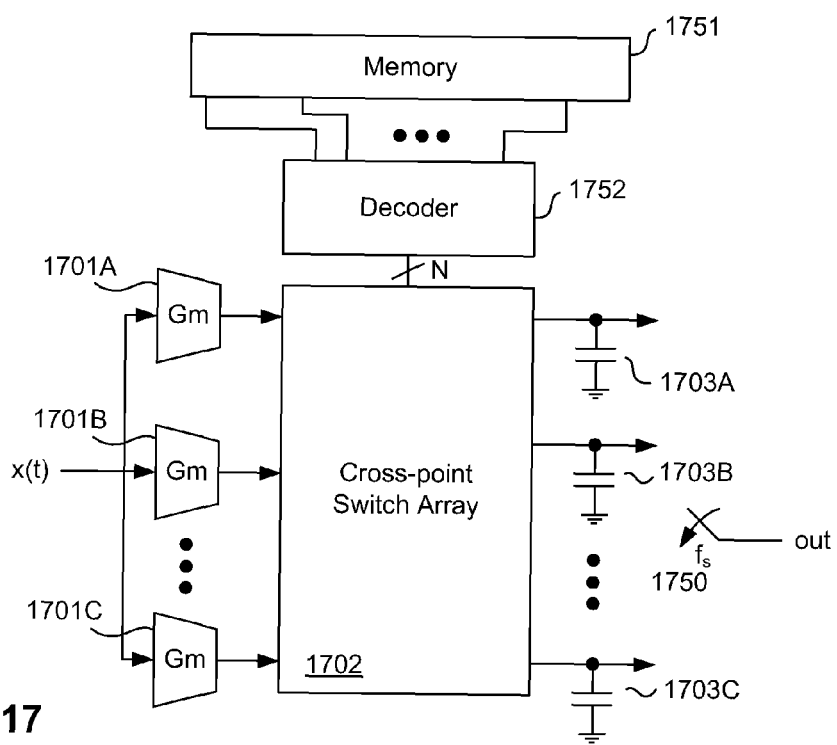
FIG. 17 is an example implementation of a programmable filter according to an embodiment of the present invention.

FIG. 17 is an example implementation of a programmable filter according to an embodiment of the present invention. Because of the property described in FIG. 16, an efficient implementation of a programmable filter may be realized. Programmable filter 1700 includes a plurality of transconductance circuits 1703A-C having inputs coupled to receive an input signal, x(t), to be filtered. The outputs of the transconductance circuits are coupled to a plurality of switches 1702. The plurality of switches may be configured to couple the output of any transconductance circuit to a plurality of capacitors 1703A-C (i.e., a cross-point switch configuration). The switches are controlled in accordance with a discrete time window function stored in memory 1751. In this example, the digital values representing the discrete time window function in memory 1751 are used to control the switches in switch array 1702. Here, a decoder 1752 is coupled to memory 1751 to receive the discrete time window values and generate control signals to couple transconductance circuits 1701A-C to capacitors 1703A-C. If a discrete time window function having the property describe in FIG. 16 is used, then at any given time, each transconductance circuit is coupled to one output capacitor, and the particular transconductance circuit outputs that are coupled to particular capacitors change at a frequency of $f_{sDAC}$. Accordingly, the switches, which are set by the discrete time window function values, control the number of transconductance circuits providing current into each capacitor. Therefore, the transconductance circuits and switches are providing weighted current values into each capacitor, where the weighted currents into each capacitor change over time in accordance with the particular discrete time window function being used. The capacitors, in turn, integrate the results, which are then successively sampled at a frequency of fs by switch 1750. When a class of window functions is used such that the sum of the window function values is a constant (i.e., FIG. 16), all transconductance circuits may be coupled to particular capacitors across the integration interval, which leads to less power loss and higher efficiency.

Figure 18:
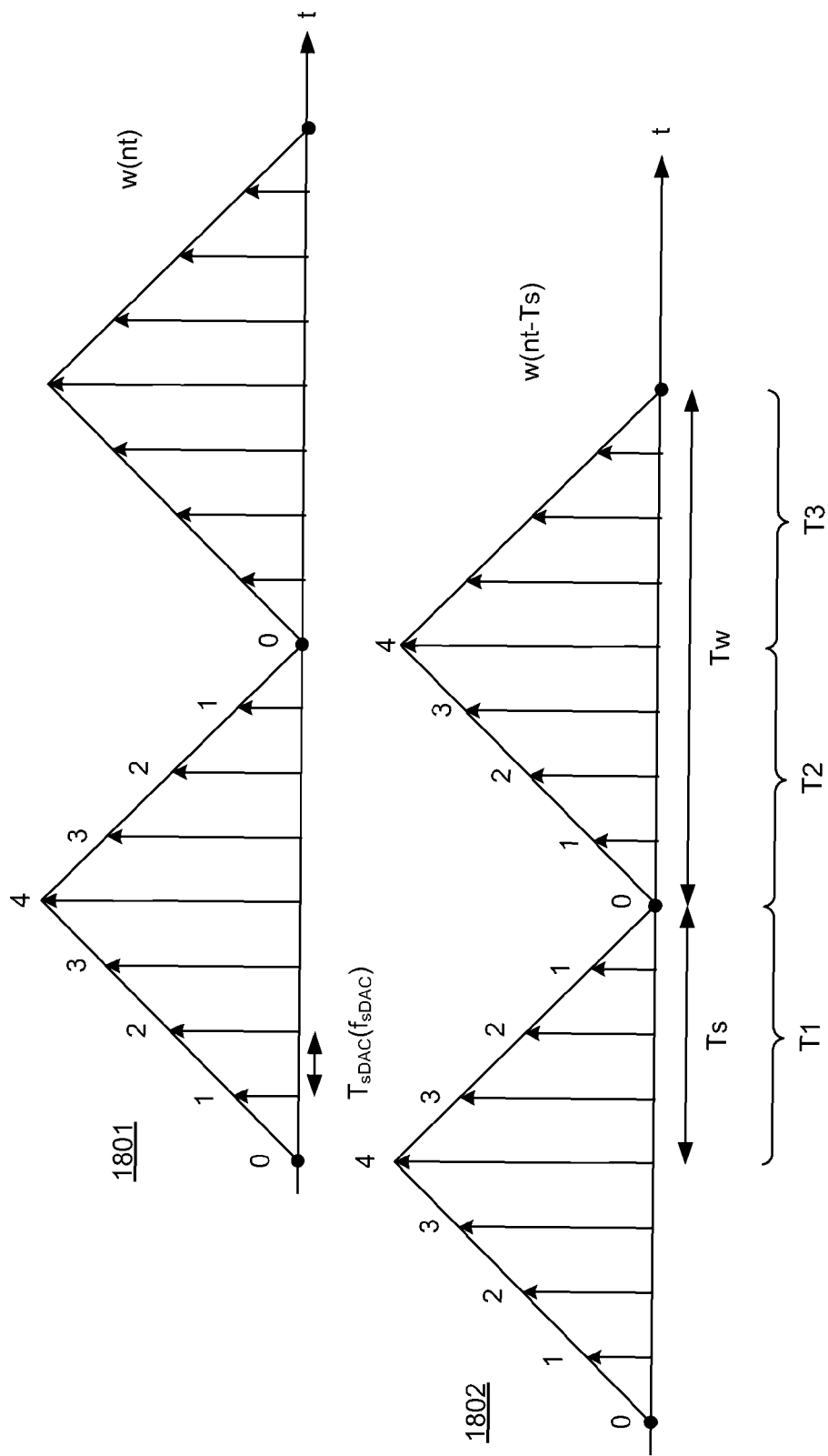
FIG. 18 is an example of a discrete time window function controlling a switch array.

FIG. 18 is an example of a discrete time window function controlling a switch array. In this illustrative example, a triangle window is used as the discrete time window function. A triangle waveform may be obtained by convolving two rectangular waveforms. Thus, the triangle window has the property described in FIG. 16. Of course, other window functions convolved with a rectangular window as described above could be used. In this example, the window function period, Tw, is related to the sample period, Ts, as follows:

$$Tw/Ts=2.$$

Thus, a programmable filter may use three (3) output capacitors to process an input signal, x(t). Digital values corresponding to the discrete time window function values are provided at a frequency of $f_{sDAC}$, and the time between each sample is therefore $T_{sDAC}$. During a time period T1, a first output capacitor ("C1") is starting a new integration cycle wherein C1 receives and integrates current in accordance with window function 1801, w(nt). Similarly, during time period T1, a second output capacitor ("C2") is half way through an integration cycle wherein C2 receives and integrates current in accordance with window function 1802, w(nt−Ts). During time period T1, the third output capacitor in this example ("C3") may be sampled and then reset, and therefore receives no current. Initially, on the first cycle of $f_{sDAC}$, the window function value of 1801 is zero (0). Accordingly, during this cycle of $f_{sDAC}$ no current is provided to C1. On the same cycle of $f_{sDAC}$, the window function value of 1802 is four (4). Thus, the current from four (4) transconductance circuits may be coupled to C2. On the next cycle of $f_{sDAC}$, window function 1801 has a value of one (1), and window function 1802 has a value of three (3). Thus, one (1) transconductance circuit current is coupled to C1 and three (3) transconductance circuit currents are coupled to C2. However, it is evident that the total transconductance circuits used by the system is still four (4), and no additional transconductance circuits are required. On the next cycle of $f_{sDAC}$, window function 1801 has a value of two (2), and window function 1802 has a value of two (2). Thus, two (2) transconductance circuit currents are coupled to C1 and two (2) transconductance circuit currents are coupled to C2. Again, it is evident that the total transconductance circuits used by the system is still four (4). Similarly, on the next cycle of $f_{sDAC}$, window function 1801 has a value of three (3), and window function 1802 has a value of one (1). Thus, three (3) transconductance circuit currents are coupled to C1 and one (1) transconductance circuit current is coupled to C2, with the total current still four (4). On the last cycle of $f_{sDAC}$ in T1, window function 1801 has a value of four (4), and window function 1802 has a value of zero (0). Thus, all the transconductance circuit currents are diverted to C1. After a settling time, C2 may now be sampled and reset. Thus, while window 1801 continues to be integrated on C1, window 1802 may now be used to start a new cycle on C3. Thus, at the beginning of this cycle of $f_{sDAC}$, C3 may be programmed with the initial value of window 1802, which in this case is zero. In a similar manner, the window functions control the switches to couple current from 4, 3, 2, 1, and then 0 transconductance circuits to C1, while coupling 0, 1, 2, 3, and then 4 transconductance circuits to C3 during time period T2. At the end of time period T2, C1 may be sampled and reset. During time period T3, capacitor C3 completes an integration cycle in accordance with window 1802 and window 1801 represents the current into capacitor C2.

The above example illustrates that embodiments of the present invention may implement programmable filters by using digital values corresponding to a discrete time window function to control switches that couple outputs of transconductance circuits to a plurality of capacitors. Referring again to FIG. 17, a discrete time window function may be stored in a shift memory, with particular memory locations provided as inputs to a decoder. Each decoder input may represent an N-bit discrete time window value to be applied against a corresponding capacitor. For example, an 8-bit number with a value of four (4) received at a decoder input may indicate that four transconductance circuit currents are to be coupled to a particular capacitor, where the current into the capacitor is:

$$Iin=x(t)*[NGm], N=4.$$

Decoder 1752 may receive the N-bit value and generate the control signals to close switches to couple four transconductance circuit currents to the specified capacitor. Other decoder inputs may control the switches to couple specified currents to other capacitors. On each cycle of $f_{sDAC}$, the memory may shift and the values provided at the decoder inputs changed. If the window function stored in memory 1751 has the property described with regard to FIG. 16, the transconductance currents will simply be rerouted between capacitors. It is to be understood that different numbers of transconductors, discrete time window functions, bit representations, output capacitors, or switch control mechanisms may be used. In one embodiment, the switches may be reconfigured at non-uniform intervals, rather than at $f_{sDAC}$ to reduce quantization error as described above.

Figure 19A:
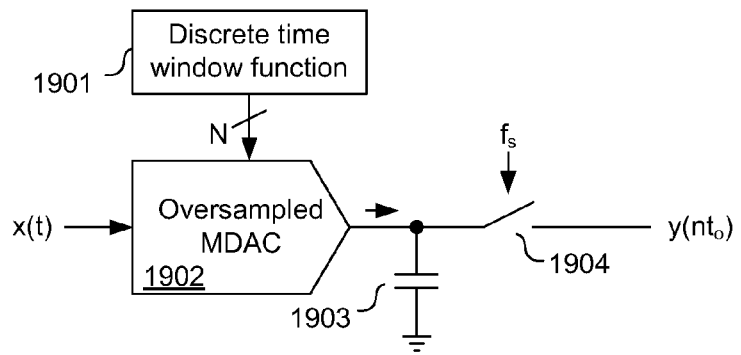
FIG. 19A-C illustrate an oversampled programmable filter according to another embodiment of the present invention.

FIG. 19A illustrates a programmable filter according to another embodiment of the present invention. In one embodiment, over-sampling techniques may be used. Over-sampling quantizer generates window samples at a higher rate. These samples are not results of direct quantization of the window function, but are further processed in a way that quantization noise of the window is shaped and moved from the frequency band of interest to other frequencies which maybe then removed by auxiliary filters as described earlier. Utilizing oversampling methods, for example, an over sampled MDAC 1901 may be used to multiply in input signal to be filtered with a stored discrete time window function 1901 and the output integrated in capacitor 1903 and sampled at a rate of fs by sampler 1904. In an over sampled system, the number of bits in the MDAC (e.g., the number of current cells or the number of transconductance circuits) is reduced and the frequency, $f_{sDAC}$, increased. In an MDAC implementation, the number of bits may be N=1 or 2 or some low value. This technique may further be advantageous when higher resolution implementations are used (e.g. 14 bit effective resolution made using N=6).

Figure 19B:
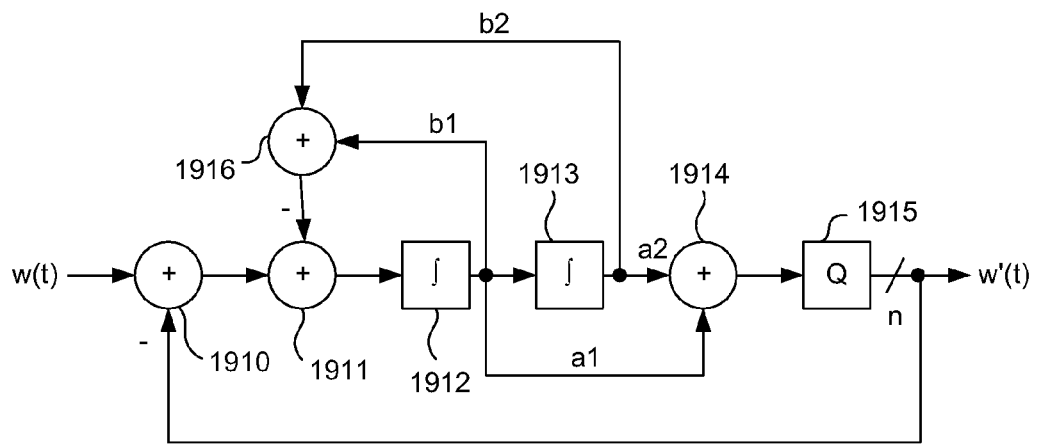
Figure 19C:
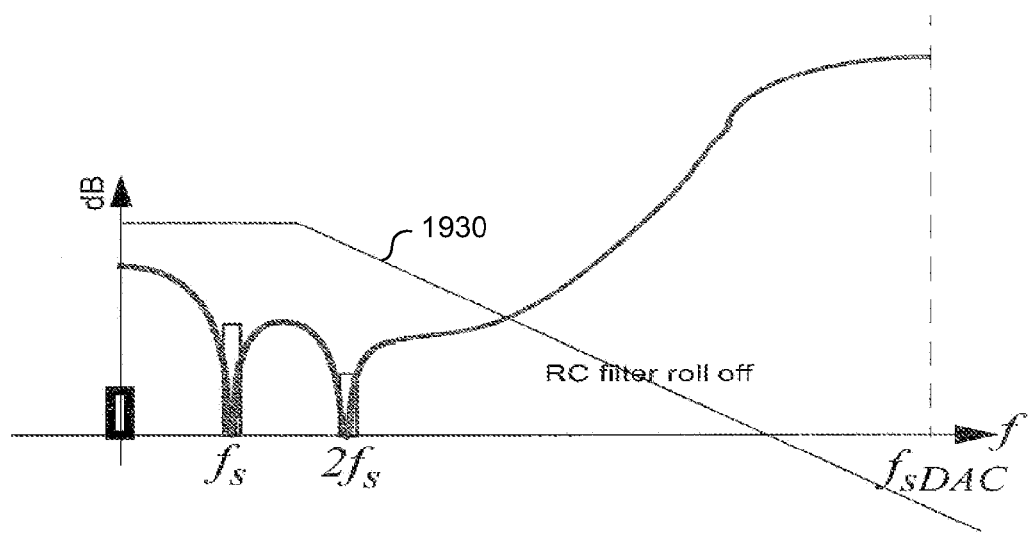

FIG. 19B illustrates a sigma-delta architecture for modifying the window function for use in an oversampled system. For an oversampled implementation, the discrete time window function may be modified for implementation in a sigma-delta over-sampling system with noise shaping. For example, a continuous time equivalent of window function, w(t), may be provided at the input of a sigma-delta to generate a modified window function, $w'(nT_{s-oversample})$, that may include fewer bits, a larger number of samples and noise shaping. FIG. 19B is an example of a second-order sigma-delta that may be used to create the modified window function, w'(t). Summing circuits 1910, 1911, 1916, 1914, integrators 1912 and 1913, and quantizer 1915 are a second order infinite impulse response ("IIR") filter with coefficients a1, a2, b1, and b2. The output is a n-bit noise shaped stream that may be truncated and stored in memory for driving an MDAC. FIG. 19C illustrates the frequency response of the modified window. The MDAC sample frequency is now much greater than the sample frequency of the programmable filter, fs. Sigma-delta zeros can be laid at the sampling rate, fs, and at integer harmonics to provide deeper null, for example, by using higher order sigma-delta architectures. The noise transfer function ("NTF") is as follows:

$$NTF=(1-Z^{-1})^N$$

From FIG. 19C it can be seen that quantization noise has been redistributed to higher frequencies by using the sigma-delta filter on the window function. At low frequencies, both the original window function, w(t), and the modified window function, w'(t), have the same response. However, at higher frequencies near $f_{sDAC}$, the quantization noise increases. Quantization noise is moved from the area of the filter nulls to higher frequencies, thereby improving the characteristics of the filter at the nulls. Accordingly, a weak auxiliary low pass filter 1930, as mentioned before, may be used to eliminate quantization noise.

Figure 20:
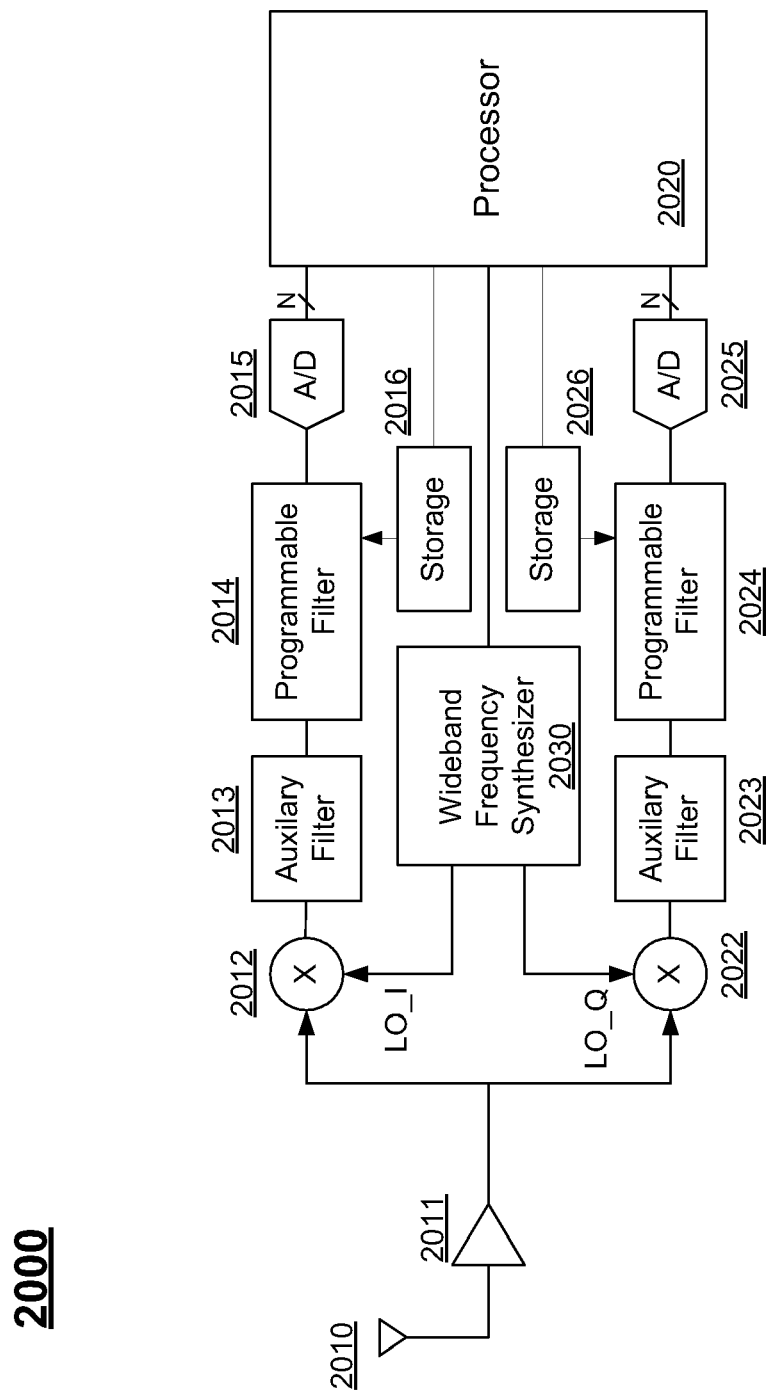
FIG. 20 is an example application a programmable filter according to embodiments of the present invention.

FIG. 20 is an example software defined radio ("SDR") application of a programmable filter according to embodiments of the present invention. An SDR is a radio which can tune to any radio band, select any channel with any bandwidth and demodulate or modulate any kind of modulated signal for the reception or transmission at anytime. This kind of radio is sometimes referred to as a reconfigurable radio. In this example, a programmable filter may be used to process R signals received on antenna 2010 for a variety of wireless formats across a broad range of frequencies. The programmable filter enables processing of signals across a wide range of frequencies, wherein any RF signal in a variety of wireless formats may be received by antenna 2010, amplified by a wideband low noise amplifier 2011, and down-converted using wideband mixers 2012 and 2022 (i.e., in-phase and quadrature components) together with a wide tuning range frequency synthesizer 2030. Wide tuning range synthesizer 2030 may be programmed to down convert any of a variety of incoming RF signals standards including cellular standards, 802.11, 802.15, for example. An example of a wideband low noise amplifier that may be used is described in commonly-owned U.S. patent application Ser. No. 10/929,206, entitled "High Frequency Wireless Receiver Circuits and Methods," filed Aug. 20, 2004, naming Rahim Bagheri, Masoud Djafari, and Mahnaz Atri as inventors, the entire disclosure of which is hereby incorporated herein by reference. An example of a wideband mixer that may be used is described in commonly-owned U.S. patent application Ser. No. 11/106,902, entitled "Mixer Circuits and Methods with Improved Spectral Purity," filed Apr. 14, 2005, naming Rahim Bagheri and Masoud Djafari as inventors, the entire disclosure of which is hereby incorporated herein by reference. An example of a wide tuning range synthesizer that may be used is described in commonly-owned U.S. patent application Ser. No. 11/142,690, entitled "High Frequency Synthesizer Circuits and Methods," filed Jun. 1, 2005, naming Mohammad E. Heidari, Ahmad Mizaei, Masoud Djafari, Mike Choi, Filipp A. Baron, Alireza Mehrnia, and Rahim Bagheri as inventors, the entire disclosure of which is hereby incorporated herein by reference. Once the signal is down converted, the baseband analog signal may be prefiltered by the auxiliary filters 2013 and 2023 described above. Next, programmable filters 2014 and 2024 may be programmed to filter according to any of a variety of wireless standards. Filters 2014 and 2024 may be programmed by storing different discrete time window functions, as described above, in storage 2016 and 2026, for example. The output of programmable filters 2014 and 2024 are samples that may be digitized by analog-to-digital converters ("A/D") 2015 and 2025. The N-bit digital outputs of the A/Ds may then be coupled to a processor 2020. Processor 2020 may include a baseband processor for digitally processing a variety of different wireless standards, for example. Because a variety of RF input signals at different frequencies and with different bandwidths may be processed by programming the filter and digitally processing the information, such systems are referred to as "software defined radio."

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while storage elements may be used to stored discrete time window functions, it is to be understood that other implementations may used such as, for example, using a programmable state machine that reconfigures MDAC inputs or the switches in an equivalent manner as a discrete time window function stored in a memory. Based on the above disclosure and the following claims, other arrangements, embodiments, implementations and equivalents will be evident to those skilled in the art and may be employed without departing from the spirit and scope of the invention as defined by the claims.

What is claimed is:

1. A programmable filter for filtering an input signal comprising:
   a storage element for storing a plurality of digital values representing a discrete time window function; and
   a plurality of filter channels, each channel comprising
      a multiplying digital-to-analog converter having a plurality of digital inputs coupled to the storage element and a continuous time analog input for receiving said input signal to be filtered, wherein said input signal is a continuous time analog signal;
      at least one capacitor having at least one terminal coupled to an output of the multiplying digital-to-analog converter; and
      a sampling device coupled between the at least one terminal of the at least one capacitor and an output of the filter.

2. The filter of claim 1 further comprising an auxiliary filter for pre-filtering the analog input.

3. The filter of claim 1 wherein the multiplying digital-to-analog converter is oversampled.

4. The filter of claim 3 wherein the plurality of digital values representing a discrete time window function are processed with sigma delta filter.

5. The filter of claim 1 wherein the multiplying digital-to-analog converter receives digital values at non-uniform time intervals.

6. The filter of claim 1 further comprising a plurality of transconductance circuits for receiving the analog input as a voltage signal and converting the analog input into a current signal.

7. The filter of claim 1 further comprising a decoder coupled between the storage element and the multiplying digital-to-analog converter.

8. The filter of claim 1 wherein the storage element is a memory.

9. The filter of claim 1 wherein the storage element is a shift memory.

10. The filter of claim 1 wherein the sampling device comprises one or more MOS transistors.

11. The filter of claim 1 wherein said programmable filter is used in a software defined radio.

12. A method of filtering a signal comprising:
storing a discrete time window function;
receiving said signal at an input of a multiplying digital-to-analog converter, wherein said signal is a continuous time analog signal;
multiplying said continuous time analog signal by the discrete time window function in the multiplying digital-to-analog converter, and in accordance therewith, generating a multiplied signal;
integrating the multiplied signal in a first capacitor; and
sampling a voltage on the first capacitor.

13. The method of claim 12 further comprising, before multiplying said signal, filtering said signal with a filter having a continuous time input and output.

14. The method of claim 12 wherein the multiplying digital-to-analog converter is oversampled, and wherein the plurality of digital values representing a discrete time window function are processed with sigma delta filter.

15. The method of claim 12 wherein the multiplying digital-to-analog converter receives digital values at non-uniform time intervals.

16. The method of claim 12 wherein the signal is a voltage signal, the method further comprising converting the voltage signal into a plurality of current signals.

17. The method of claim 12 further comprising shifting the discrete time window function to successively provide discrete time window function values to the multiplying digital-to-analog converter.

18. The method of claim 12 further comprising decoding the discrete time window function.

\* \* \* \* \*